US006737218B2

(12) United States Patent
Mori

(10) Patent No.: US 6,737,218 B2
(45) Date of Patent: May 18, 2004

(54) PRINTING PLATE PRECURSOR, IMAGE FORMING METHOD EMPLOYING THE SAME, AND PRINTING METHOD

(75) Inventor: Takahiro Mori, Hino (JP)

(73) Assignee: Konica Corporation (JP)

( * ) Notice: Subject to any disclaimer, the term of this patent is extended or adjusted under 35 U.S.C. 154(b) by 0 days.

(21) Appl. No.: 10/161,432

(22) Filed: May 30, 2002

(65) Prior Publication Data

US 2003/0148218 A1 Aug. 7, 2003

(30) Foreign Application Priority Data

Jun. 14, 2001 (JP) ....................................... 2001-179962

(51) Int. Cl.$^7$ .................................................. G03F 7/09

(52) U.S. Cl. ................. 430/271.1; 430/138; 430/272.1; 430/273.1; 101/453

(58) Field of Search .............................. 430/138, 270.1, 430/271.1, 272.1, 273.1, 302, 348, 944, 945; 101/453, 463.1

(56) References Cited

U.S. PATENT DOCUMENTS

| | | | | | |
|---|---|---|---|---|---|
| 3,628,953 | A | * | 12/1971 | Brinckman | 430/325 |
| 5,985,515 | A | * | 11/1999 | Van Rompuy et al. | 430/272.1 |
| 6,068,965 | A | * | 5/2000 | Hauquier et al. | 430/302 |
| 6,132,934 | A | * | 10/2000 | Vermeersch et al. | 430/273.1 |
| 6,230,621 | B1 | * | 5/2001 | Verschueren et al. | 101/453 |
| 6,399,270 | B1 | * | 6/2002 | Mori et al. | 430/270.1 |
| 6,420,091 | B1 | * | 7/2002 | Nakayama et al. | 430/302 |
| 6,596,462 | B2 | * | 7/2003 | Mori | 430/272.1 |
| 2001/0036592 | A1 | * | 11/2001 | Hoshi et al. | 430/270.1 |
| 2002/0172891 | A1 | * | 11/2002 | Mori | 430/302 |

* cited by examiner

*Primary Examiner*—Mark F. Huff
*Assistant Examiner*—Barbara Gilliam
(74) *Attorney, Agent, or Firm*—Muserlian, Lucas and Mercanti

(57) ABSTRACT

Disclosed is a printing plate precursor comprising a substrate and provided thereon, a layer containing a light heat conversion material, wherein the light heat conversion material does not substantially change in nature when allowed to stand in a temperature atmosphere of 400 to 500° C. for 10 minutes or a printing plate precursor comprising a substrate and provided thereon, a hydrophilic layer which is porous, wherein the hydrophilic layer contains a carbon atom-free material in an amount of not less than 91% by weight.

29 Claims, 1 Drawing Sheet

PRINTING PLATE PRECURSOR, IMAGE FORMING METHOD EMPLOYING THE SAME, AND PRINTING METHOD

FIELD OF THE INVENTION

The present invention relates to a printing plate precursor and particularly to a printing plate precursor capable of forming an image by a computer to plate (CTP) system.

BACKGROUND OF THE INVENTION

The printing plate precursor for CTP, which is inexpensive, can be easily handled, and has a printing ability comparable with that of a PS plate, is required accompanied with the digitization of printing data. Recently, many types of CTP by infrared laser recording have been proposed.

As one of these CTP, there is a process called as a wet type CTP in which solubility to a developer of an image forming layer of a printing plate precursor is changed by light exposure, followed by development to form an image. However, this process has various problems that an exclusive alkaline developer is necessary for development as in a conventional PS plate, developability is changed due to developer conditions (such as temperature and degree of fatigue), image reproduction is poor, and the handling ability in a lighted room is limited.

In view of the above, a dry CTP including development on a printing press has been developed, in which a specific developing process is not required. The printing plate precursor for dry CTP has been noticed since it can be applied to a printing press employing a so-called direct imaging (DI) process in which an image is formed on a printing press, followed by printing.

As one example of the dry CTP, there is an ablation type CTP, as disclosed in for example, Japanese Patent O.P.I. Publication Nos. 8-507727, 6-186750, 6-199064, 7-314934, 10-58636 and 10-244773.

These references disclose a printing plate precursor comprising a substrate and a hydrophilic layer or a lipophilic layer as an outermost layer. In the printing plate precursor having a hydrophilic layer as an outermost layer, the hydrophilic layer is imagewise exposed to imagwise ablate the hydrophilic layer, whereby the lipophilic layer is exposed to form image portions. However, there are problems that the ablation requires a high energy, resulting in a low sensitivity, and that the image formation due to physical breakage of the layer provides low dissolving power and a low dot quality.

Moreover, there are another problem that the contamination of the interior of the exposing apparatus by the scattered matter caused by the ablation of the surface layer. Accordingly, it is often necessary to have a built-in cleaning means such as a specific sucking device or a contamination preventing means such as to cover the surface of the printing plate element by a cover sheet, for solving such the problem. Furthermore, the process cannot be regarded to a complete dry process since it is necessary to remove the ablation residue remained on the plate surface by a means such as wiping or rinsing by an exclusive device.

In view of the above, a printing plate precursor, which is excellent in printing performance or a handling property, is required also as a printing plate precursor for an ablation type CTP.

On the other hand, a printing plate precursor, which is capable of forming an image without ablation and of requiring no development with a specific developer or wiping, has been proposed. and provides a good printing performance. There is a printing plate precursor for CTP capable of being developed (development on press) with dampening water on a printing press disclosed in, for example, U.S. Pat. Nos. 2,938,397 and 2,938,398, which comprises an image forming layer containing thermoplastic polymer particles and a water soluble binder. However, such a planographic printing plate, when a grained aluminum plate is used as a hydrophilic substrate, is required to contain a light heat conversion material (generally colored) in the hydrophilic layer, and may contaminate a printing press in development on press.

As a method to prevent the printing press contamination in development on press, there has been proposed a method employing a printing plate precursor comprising a substrate having a hydrophilic layer containing a light heat conversion material. This hydrophilic layer can eliminate a light heat conversion material from an image forming layer, but it is difficult to give such a substrate having the hydrophilic layer to a printing performance equal to the grained aluminum substrate. Many proposals have been made, but those having a sufficient printing performance have not yet been obtained.

For example, Japanese Patent O.P.I. Publication No. 2000-355178 discloses a hydrophilic layer containing a hydrophilic light heat conversion material. However, hydrophilicity of other materials contained in the hydrophilic layer is not taken into consideration, and in the examples, no contamination is produced when printing is carried out employing dampening water containing isopropanol in an amount of 10% by volume. This hydrophilic layer is not suitable for printing carried out employing dampening water containing no isopropanol, which is required at present for improving working environment.

Further, change in nature of the light heat conversion material contained in the hydrophilic layer, which occurs on image formation employing heat generated by the light heat conversion material subjected to infrared laser exposure, is not considered, also. The change in nature of the light heat conversion material itself (such as oxidation, decoloration or vaporization) may lower strength of the hydrophilic layer at image portions after image formation, which may lead to the problems that in printing, images or the hydrophilic layer are removed.

SUMMARY OF THE INVENTION

A first object of the invention is to provide a printing plate precursor having a hydrophilic layer which is applied to CTP requiring no specific development, and provides a good printing performance. A second object of the invention is to provide a printing plate precursor having a hydrophilic layer containing a light heat conversion material, in which when subjected to infrared laser exposure, an image can be formed without ablation. A third object of the invention is to provide a printing plate precursor having a hydrophilic layer, in which after subjected to infrared laser exposure and heated, the strength of the hydrophilic layer is not lowered. A fourth object of the invention is to provide a printing method employing the printing plate precursor described above, which provides a good working environment.

DETAILED DESCRIPTION OF THE INVENTION

Figure 1:
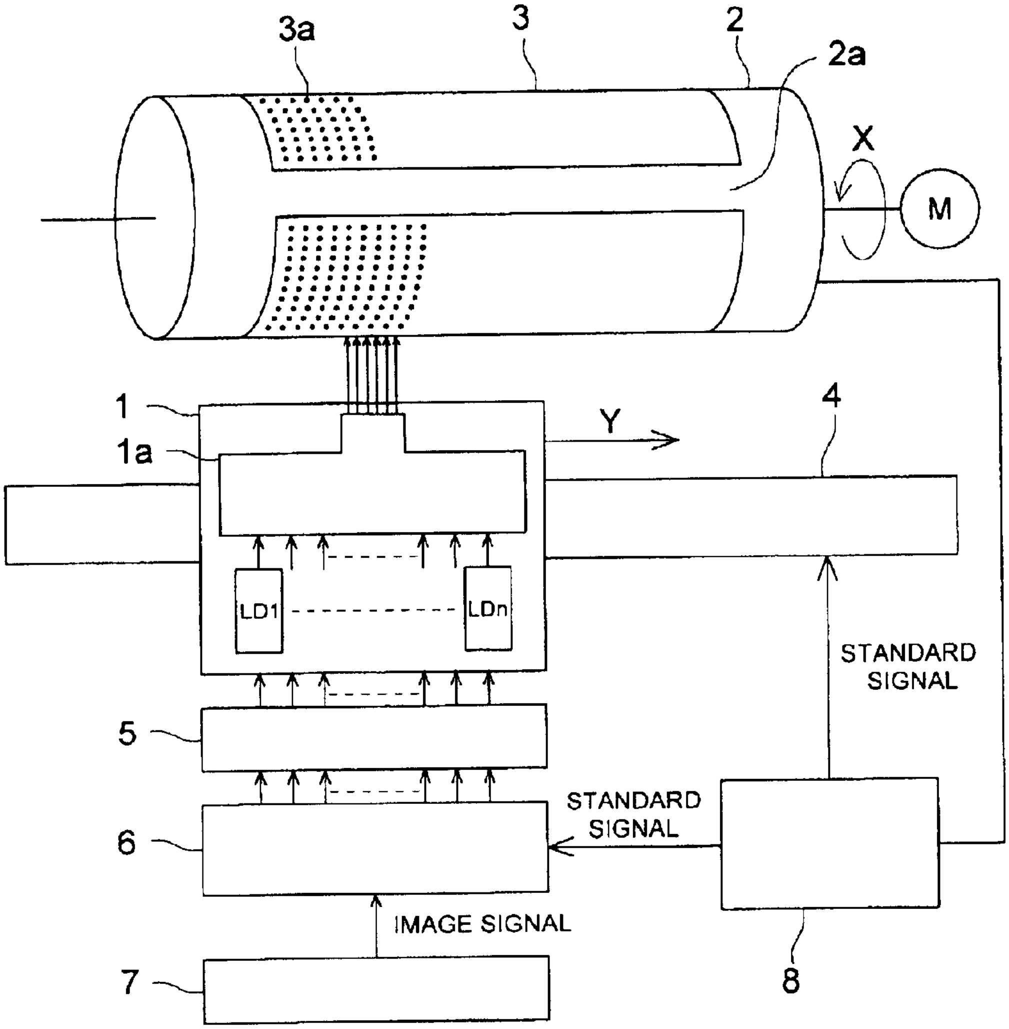
FIG. 1 shows a schematic view of a scanning exposure system used in the invention.

The above object has been attained by one of the following constitutions:

1. A printing plate precursor comprising a substrate and provided thereon, a layer containing a light heat conversion material, wherein the light heat conversion material is a material which does not substantially change in nature when allowed to stand in a temperature atmosphere of 400 to 500° C. for 10 minutes.

2. The printing plate precursor of item 1, wherein the light heat conversion material is a metal oxide.

3. The printing plate precursor of item 2, wherein the metal oxide is a complex metal oxide comprising at least two kinds of metals.

4. The printing plate precursor of item 3, wherein the complex metal oxide comprises at least two metals selected from the group consisting of Al, Ti, Cr, Mn, Fe, Co, Ni, Cu, Zn, Sb, and Ba.

5. The printing plate precursor of item 4, wherein the complex metal oxide is a Cu—Cr—Mn type metal oxide, or a Cu—Fe—Mn type metal oxide.

6. The printing plate precursor of item 1, wherein the light heat conversion material has an average primary particle size of 0.001 to 1.0 μm.

7. The printing plate precursor of item 6, wherein the light heat conversion material has an average primary particle size of 0.01 to 0.5 μm.

8. The printing plate precursor of item 1, wherein the light heat conversion material has been allowed to stand in a temperature atmosphere of 400 to 500° C. for 10 minutes in its manufacture process.

9. A printing plate precursor comprising a substrate and provided thereon, a hydrophilic layer which is porous, wherein the hydrophilic layer contains a carbon atom-free material in an amount of not less than 91% by weight.

10. The printing plate precursor of item 9, wherein the hydrophilic layer contains the carbon atom-free material in an amount of not less than 95% by weight.

11. The printing plate precursor of item 9, wherein the carbon atom-free material is a metal oxide.

12. The printing plate precursor of item 11, wherein the metal oxide is colloidal silica.

13. The printing plate precursor of item 12, wherein the colloidal silica is necklace-shaped colloidal silica.

14. The printing plate precursor of item 12, wherein the colloidal silica particles have an average particle size of 1 to 20 nm.

15. The printing plate precursor of item 12, wherein the colloidal silica provides an alkaline colloidal silica solution as a colloid solution.

16. The printing plate precursor of item 11, wherein the metal oxide particles are porous metal oxide particles.

17. The printing plate precursor of item 16, wherein the porous metal oxide particles are porous silica particles, porous aluminosilicate particles or zeolite particles.

18. The printing plate precursor of item 11, wherein the metal oxide particles are layer structural clay mineral particles.

19. The printing plate precursor of item 9, wherein the hydrophilic layer further contains a carbon atom-containing material which is water soluble, and wherein at least a part of the carbon atom-containing material exists in the hydrophilic layer in a state capable of being dissolved in water.

20. The printing plate precursor of item 19, wherein the carbon atom-containing material is a saccharide.

21. The printing plate precursor of item 20, wherein the saccharide is a polysaccharide.

22. The printing plate precursor of item 9, wherein the hydrophilic layer further contains a surfactant.

23. The printing plate precursor of item 22, wherein the surfactant comprises a silicon atom.

24. The printing plate precursor of item 9, wherein the hydrophilic layer further contains a phosphate.

25. The printing plate precursor of item 9, wherein the hydrophilic layer further contains a light heat conversion material.

26. The printing plate precursor of item 25, wherein the light heat conversion material is a material which does not substantially change in nature in a temperature atmosphere of 400 to 500° C. for ten minutes.

27. The printing plate precursor of item 26, wherein the light heat conversion material is a metal oxide.

28. The printing plate precursor of item 27, wherein the metal oxide is a complex metal oxide comprising at least two kinds of metals.

29. The printing plate precursor of item 28, wherein the complex metal oxide comprises at least two metals selected from the group consisting of Al, Ti, Cr, Mn, Fe, Co, Ni, Cu, Zn, Sb, and Ba.

30. The printing plate precursor of item 29, wherein the complex metal oxide is a Cu—Cr—Mn type metal oxide or a Cu—Fe—Mn type metal oxide.

31. The printing plate precursor of item 25, wherein the light heat conversion material has an average primary particle size of 0.001 to 1.0 μm.

32. The printing plate precursor of item 31, wherein the light heat conversion material has an average primary particle size of 0.01 to 0.5 μm.

33. The printing plate precursor of item 26, wherein the light heat conversion material has been allowed to stand in a temperature atmosphere of 400 to 500° C. for 10 minutes in its manufacture process.

34. The printing plate precursor of item 9, wherein the printing plate precursor further comprises a functional layer capable of forming an image.

35. The printing plate precursor of item 9, wherein an ablation layer being ablated by heat application is provided between the substrate and the hydrophilic layer, and a layer containing a water soluble material is provided on the hydrophilic layer.

36. The printing plate precursor of item 35, wherein the water soluble material is a saccharide.

37. The printing plate precursor of item 36, wherein the saccharide is a polysaccharide.

38. The printing plate precursor of item 9, wherein a layer containing at least one selected from heat fusible particles and thermoplastic particles is provided on the hydrophilic layer.

39. The printing plate precursor of item 38, wherein the layer containing at least one selected from heat fusible particles and thermoplastic particles further contains a water soluble material.

40. The printing plate precursor of item 39, wherein the water soluble material is a saccharide.

41. The printing plate precursor of item 40, wherein the saccharide is an oligosaccharide.

101. A printing plate precursor comprising a substrate and provided thereon, a layer containing a light heat conversion material, wherein the light heat conversion material is a material which does not substantially change in nature in an oxidation atmosphere at 400° C.

102. The printing plate precursor of item 101, wherein the light heat conversion material is a metal oxide.

103. The printing plate precursor of item 102, wherein the metal oxide is a complex metal oxide comprising at least two kinds of metals.

104. The printing plate precursor of item 103, wherein the complex metal oxide comprises at least two metals selected from the group consisting of Al, Ti, Cr, Mn, Fe, Co, Ni, Cu, Zn, Sb, and Ba.

105. The printing plate precursor of item 104, wherein the complex metal oxide comprises a Cu—Cr—Mn type metal oxide, or a Cu—Fe—Mn type metal oxide.

106. The printing plate precursor of any one of items 101 through 105, wherein the light heat conversion material has an average primary particle size of 0.001 to 1.0 μm.

107. The printing plate precursor of item 106, wherein the light heat conversion material has an average primary particle size of 0.01 to 0.5 μm.

108. The printing plate precursor of any one of items 101 through 107, wherein the light heat conversion material has been allowed to stand in an oxidation atmosphere at not less than 400° C. in its manufacture process.

109. A printing plate precursor comprising a substrate and provided thereon, a hydrophilic layer which is porous, wherein the hydrophilic layer contains a carbon atom-free material in an amount of not less than 91% by weight.

110. The printing plate precursor of item 109, wherein the hydrophilic layer contains the carbon atom-free material in an amount of not less than 95% by weight.

111. The printing plate precursor of item 109 or 110, wherein the carbon atom-free material is a metal oxide.

112. The printing plate precursor of item 111, wherein the metal oxide comprises colloidal silica.

113. The printing plate precursor of item 112, wherein the colloidal silica comprises necklace-shaped colloidal silica.

114. The printing plate precursor of item 112, wherein the colloidal silica particles have an average particle size of 1 to 20 nm.

115. The printing plate precursor of any one of items 112 through 114, wherein the colloidal silica provides an alkaline colloidal silica solution as a colloid solution.

116. The printing plate precursor of any one of items 111 through 115, wherein the metal oxide comprises porous metal oxide particles.

117. The printing plate precursor of item 116, wherein the porous metal oxide particles comprise porous silica particles, porous aluminosilicate particles or zeolite particles.

118. The printing plate precursor of any one of items 111 through 117, wherein the metal oxide comprises layer structural clay mineral particles.

119. The printing plate precursor of any one of items 109 through 118, wherein the hydrophilic layer further contains a carbon atom-containing material which is water soluble, and wherein at least a part of the carbon atom-containing material exists in the hydrophilic layer in a state capable of being dissolved in water.

120. The printing plate precursor of item 119, wherein the carbon atom-containing material comprises a saccharide.

121. The printing plate precursor of item 120, wherein the saccharide is a polysaccharide.

122. The printing plate precursor of any one of items 109 through 121, wherein the hydrophilic layer further contains a surfactant.

123. The printing plate precursor of item 122, wherein the surfactant comprises a silicon atom.

124. The printing plate precursor of any one of items 109 through 123, wherein the hydrophilic layer further contains a phosphate.

125. The printing plate precursor of any one of items 109 through 124, wherein the hydrophilic layer further contains a light heat conversion material.

126. The printing plate precursor of item 125, wherein the light heat conversion material is a material which does not substantially change in nature in an oxidation atmosphere at 400° C.

127. The printing plate precursor of item 126, wherein the light heat conversion material is a metal oxide.

128. The printing plate precursor of item 127, wherein the metal oxide is a complex metal oxide comprising at least two kinds of metals.

129. The printing plate precursor of item 128, wherein the complex metal oxide comprises at least two metals selected from the group consisting of Al, Ti, Cr, Mn, Fe, Co, Ni, Cu, Zn, Sb, and Ba.

130. The printing plate precursor of item 129, wherein the complex metal oxide comprises a Cu—Cr—Mn type metal oxide, or a Cu—Fe—Mn type metal oxide.

131. The printing plate precursor of any one of items 125 through 130, wherein the light heat conversion material has an average primary particle size of 0.001 to 1.0 μm.

132. The printing plate precursor of item 131, wherein the light heat conversion material has an average primary particle size of 0.01 to 0.5 μm.

133. The printing plate precursor of any one of items 126 through 132, wherein the light heat conversion material has been allowed to stand in an oxidation atmosphere at not less than 400° C. in its manufacture process.

134. The printing plate precursor of any one of items 101 through 133, wherein a functional layer capable of forming an image is further provided on the substrate.

135. The printing plate precursor of item 134, wherein an image is formed on the functional layer by imagewise heat application.

136. An image forming method comprising the step of imagewise exposing the printing plate precursor of item 135 employing a near-infrared laser or an infrared laser to form an image.

137. An image forming method comprising the step of imagewise providing a lipophilic material onto the printing plate precursor of any one of items 109 through 124 to form an image.

138. The image forming method of item 137, wherein the imagewise providing is carried out employing a thermal transfer process.

139. The image forming method of item 137, wherein the imagewise providing is carried out employing an ink jet process.

140. The printing plate precursor of any one of items 109 through 124, comprising the substrate and provided thereon, a layer being ablated by heat application, the hydrophilic layer, and a layer containing a water soluble material, in that order.

141. The printing plate precursor of item 140, wherein the water soluble material is a saccharide.

142. The printing plate precursor of item 141, wherein the saccharide is a polysaccharide.

143. The printing plate precursor of any one of items 109 through 133, comprising the substrate and provided thereon, the hydrophilic layer, and a layer containing at least one selected from heat fusible particles and thermoplastic particles, in that order.

144. The printing plate precursor of item 143, wherein the layer containing at least one selected from heat fusible particles and thermoplastic particles further contains a water soluble material.

145. The printing plate precursor of item 144, wherein the water soluble material is a saccharide.

146. The printing plate precursor of item 145, wherein the saccharide is an oligosaccharide.

147. A method of printing comprising the steps of forming an image on the printing plate precursor of any one of items 109 through 135 and items 140 through 146, and supplying dampening water containing an alcohol in amount of not more than 5% by weight to the printing plate precursor with the formed image.

148. The method of printing of item 147, comprising the steps of supplying dampening water containing no alcohol to the printing plate precursor with the formed image.

149. The method of printing of item 147 or 148, wherein the image formation is carried out on a printing press.

The present invention will be detailed below.

The printing plate precursor of the invention is characterized in that the printing plate precursor comprises a substrate and provided thereon, a layer containing a light heat conversion material (hereinafter referred to also as a light heat conversion layer) wherein the light heat conversion material is a material which does not substantially change in nature when allowed to stand in a temperature atmosphere of 400 to 500° C. for 10 minutes. Herein, "a material which does not substantially change in nature when allowed to stand in a temperature atmosphere of 400 to 500° C. for 10 minutes" implies a material which is not oxidized, decomposed, melted nor gasified even when allowed to stand in a temperature atmosphere of 400 to 500° C. for 10 minutes. One embodiment of the printing plate precursor of the invention is a printing plate precursor comprising a substrate and provided on the substrate, the layer containing the light heat conversion material and provided on the layer, a functional layer which is capable of forming an image by heat, wherein an image can be formed by infrared laser exposure.

Depending on a printing method or an image forming mechanism, there are, for example, the following eight combinations of the light heat conversion layer and the functional layer as shown in Table 1 in the printing plate precursor.

TABLE 1

| Printing method | *N or P | Light heat conversion layer (heated at exposed portions) | Functional layer | Image portions | Non-image portions |
|---|---|---|---|---|---|
| Dampening water employing | N | Hydrophilic or Lipophilic | Change from hydrophilic to lipophilic due to heat | Exposed functional layer | Unexposed functional layer |
| Dampening water employing | N | Hydrophilic | Lipophilic layer fixed due to heat (unexposed portions are removed) | Exposed functional layer | Hydrophilic layer under functional layer |
| Dampening water employing | P | Hydrophilic or Lipophilic | Change from lipophilic to hydrophilic due to heat | Unexposed functional layer | Exposed functional layer |
| Dampening water employing | P | Lipophilic | Hydrophilic layer removed due to heat (exposed portions are removed) | Unexposed functional layer | Lipophilic layer under functional layer |
| Waterless | N | Ink-repellent or Lipophilic | Change from ink-repellent to lipophilic due to heat | Exposed functional layer | Unexposed functional layer |
| Waterless | N | Ink-repellent | Lipophilic layer fixed due to heat (unexposed portions are removed) | Exposed functional layer | Ink-repellent layer under functional layer |
| Waterless | P | Ink-repellent or Lipophilic | Change from lipophilic to ink-repellent due to heat | Unexposed functional layer | Exposed fuctional layer |
| Waterless | P | Lipophilic | Ink-repellent layer removed due to heat (exposed portions are removed) | Unexposed functional layer | Lipophilic layer under functional layer |

In Table 1, "*N or P" shows negative working or positive working.

In such a printing plate precursor, a layer containing a light heat conversion material (hereinafter referred to also a light heat conversion layer) is heated to several hundred Celsius degrees by infrared ray exposure. Particularly, it is considered that the surface of a light heat conversion material in the form of particles, when subjected to infrared ray exposure, is rapidly heated. That exposure may cause the problem that the light heat conversion material itself is changed in the nature (for example, decomposed or oxidized) or that the state of the bonding between the light heat conversion material and a material constituting a matrix fixing the light heat conversion material is changed (for example, voids are produced). This results in lowering the strength of the light heat conversion layer.

As typical problems, there is the problem in the negative working printing plate precursor as shown in Table 1 above that lowering of the layer strength at exposed portions (image portions) results in removal of small dots or lowering of printing durability, there is the problem in the positive working printing plate precursor as shown in Table 1 above that lowering of the layer strength at exposed portions (non-image portions) results in background contamination, and there is the problem in both printing plate precursors that an exposure device is contaminated with ablated materials produced by explosive breakage (ablation) of the light heat conversion layer due to heat generated by laser exposure. These phenomena are likely to be caused when exposure is carried out at high illumination and at short time employing a high power laser having a small beam spot diameter, or when a more precise image or high production efficiency is required.

Use of the light heat conversion material in the invention, which does not substantially change in nature when allowed to stand in a temperature atmosphere of 400 to 500° C. for 10 minutes, can provide a printing plate precursor capable of forming an image with a high precision by infrared ray exposure, which is suitably applied to image forming processes of various mechanisms, and can provide a printing plate precursor which can be manufactured with high production efficiency.

Examples of the light heat conversion material include various dyes (described later), carbon black, graphite, a metal film, metal particles, a metal oxide film and metal oxide particles.

Of these, the dyes have a low heat resistance, and are likely to be thermally decomposed, resulting in deterioration of layer strength. The carbon black or graphite burns at high temperature. Their application to a printing plate precursor causes problems such as ablation, and therefore, condition of infrared ray exposure to the printing plate precursor is limited. The metal film or metal particles are oxidized at high temperature, and are likely to result in ablation or deterioration of layer strength.

Examples of a light heat conversion material, which is stable under condition of high temperature, include metal oxides. As the metal oxides having a light heat conversion ability, materials having black color in the visible regions or materials which are electro-conductive or semi-conductive can be used.

Examples of the former include black iron oxide ($Fe_3O_4$), and black complex metal oxides containing at least two metals. Examples of the latter include Sb-doped $SnO_2$ (ATO), Sn-added $In_2O_3$ (ITO), $TiO_2$, TiO prepared by reducing $TiO_2$ (titanium oxide nitride, generally titanium black).

Of these metal oxides, black iron oxide having black color, black complex metal oxides and titanium black have a high light heat conversion efficiency, and are preferably used when only light heat conversion ability is employed. However, the black iron oxide changes to brown-colored iron oxide at high temperature, and has a problem of lowering layer strength due to laser exposure condition. The titanium black also is oxidized at a temperature of less than 400° C. to white-colored titanium dioxide, and has also a problem of lowering layer strength due to laser exposure condition.

Examples of the light heat conversion material, which does not substantially change in nature when allowed to stand in a temperature atmosphere of 400 to 500° C. for 10 minutes, include black complex metal oxides containing at least two metals. Typically, the black complex metal oxides include complex metal oxides comprising at least two selected from Al, Ti, Cr, Mn, Fe, Co, Ni, Cu, Zn, Sb, and Ba. These can be prepared according to the methods disclosed in Japanese Patent O.P.I. Publication Nos. 9-27393, 9-25126, 9-237570, 9-241529 and 10-231441.

The complex metal oxide used in the invention is preferably a complex Cu—Cr—Mn type metal oxide or a Cu—Fe—Mn type metal oxide. The Cu—Cr—Mn type metal oxides are preferably subjected to the treatment disclosed in Japanese Patent O.P.I. Publication Nos. 8-27393 in order to reduce isolation of a 6-valent chromium ion. These complex metal oxides have a high color density and a high light heat conversion efficiency as compared with another metal oxide.

The primary average particle size of these complex metal oxides is preferably from 0.001 to 1.0 $\mu$m, and more preferably from 0.01 to 0.5 $\mu$m. The primary average particle size of from 0.001 to 1.0 $\mu$m improves a light heat conversion efficiency relative to the addition amount of the particles, and the primary average particle size of from 0.05 to 0.5 $\mu$m further improves a light heat conversion efficiency relative to the addition amount of the particles. The light heat conversion efficiency relative to the addition amount of the particles depends on a dispersity of the particles, and the well-dispersed particles have a high light heat conversion efficiency. Accordingly, these complex metal oxide particles are preferably dispersed according to a known dispersing method, separately to a dispersion liquid (paste), before being added to a coating liquid for the particle containing layer. The metal oxides having a primary average particle size of less than 0.001 are not preferred since they are difficult to disperse. A dispersant is optionally used for dispersion. The addition amount of the dispersant is preferably from 0.01 to 5% by weight, and more preferably from 0.1 to 2% by weight, based on the weight of the complex metal oxide particles. The dispersant used is not specifically limited, but when a light heat conversion layer is preferably hydrophilic (functions as non-image portions in printing employing dampening water), the dispersant is preferably a silicon atom-containing surfactant.

The addition amount of the complex metal oxide in the light heat conversion layer is preferably 0.1 to 50% by weight, more preferably 1 to 30% by weight, and most preferably 3 to 25% by weight.

In the invention, in order to secure a light heat conversion material which does not substantially change in nature when allowed to stand in a temperature atmosphere of 400 to 500° C. for 10 minutes, it is preferred that the light heat conversion material has been allowed to stand in a temperature atmosphere of not less than 400° C. in its manufacture process.

Examples of the manufacture process include those disclosed in Japanese Patent O.P.I. Publication Nos. 8-27393, 9-25126, 9-237570, 9-241529 and 10-231441.

The light heat conversion layer preferably contains a binder, and may contain various additives. The binder or additives contained in the light heat conversion layer is different due to kinds of the printing plate precursor as shown in Table 1.

When the light heat conversion layer does not require a function such as hydrophilicity, lipophilicity or water repellency, the binder is not specifically limited, and any known binder can be used as the binder, as long as an intended functional layer can be provided on the light heat conversion layer.

When the light heat conversion layer requires a hydrophilic function, the binder or additives used in the hydrophilic layer described later are preferably used, but any known binder or additives can be used, as long as an intended functional layer can be provided on the light heat conversion layer, and provides hydrophilicity.

When the light heat conversion layer requires a lipophilic function, a solvent soluble resin or a resin emulsion as an aqueous coating liquid can be used, but any known one can be used, as long as an intended functional layer can be provided on the light heat conversion layer, and provides lipophilicity.

When the light heat conversion layer requires a water repellent function, a silicon resin as generally used in a waterless printing plate precursor can be used, but any known resin can be used, as long as an intended functional layer can be provided on the light heat conversion layer, and provides a water repellent function.

Another embodiment of the printing plate precursor of the invention is a printing plate precursor comprising a substrate and provided thereon, a hydrophilic layer which is porous, wherein the hydrophilic layer contains a carbon atom-free material in an amount of not less than 91% by weight. The hydrophilic layer contains the carbon atom-free material in an amount of preferably not less than 95% by weight.

Herein, the content (% by weight) of the carbon atom-free material in the hydrophilic layer implies a percentage by weight of the hydrophilic layer except for organic compounds, organic group parts of materials having an organic group, carbon black, or graphite. With respect to a carbon atom-free material surface treated with a carbon atom-containing material, the carbon atom-containing material only is regarded as a carbon atom-containing material.

In the above, materials constituting the hydrophilic layer in the invention are those contained in the solid hydrophilic layer to have been formed. Materials, which are contained in a coating liquid for the hydrophilic layer but vaporized while the coating liquid is coated on a substrate and dried, are excluded. Further, materials permeated into the pores of the porous materials after the hydrophilic layer has been formed are also excluded.

The hydrophilic layer, containing a carbon atom-free material in an amount of not less than 91% by weight, and Preferably of not less than 95% by weight, reduces waste paper at the beginning of printing, reduces blanket contamination in printing, and provides a good printing performance such that prints without contamination are obtained over a long run of printing.

The carbon atom-free material used in the hydrophilic layer of the printing plate precursor of the invention is preferably a metal oxide.

The metal oxide preferably contains metal oxide particles. Examples of the metal oxide particles include a colloidal silica, an alumina sol, a titania sol and another metal oxide sol. The metal oxide particles may have any shape such as spherical, needle-like, and feather-like shape. The average particle size is preferably from 3 to 100 nm, and plural kinds of metal oxide each having a different size may be used in combination. The surface of the particles may be subjected to surface treatment.

The metal oxide particles can be used as a binder, utilizing its layer forming ability. The metal oxide particles are suitably used in a hydrophilic layer since they minimize lowering of the hydrophilicity of the layer as compared with an organic compound binder.

Among the above-mentioned, colloidal silica is particularly preferred. The colloidal silica has a high layer forming ability under a drying condition with a relative low temperature, and can provide a good layer strength to even a layer containing a carbon atom free material in an amount of not less than 91% by weight.

It is preferred that the colloidal silica described above is necklace-shaped colloidal silica or colloidal silica particles having an average particle size of not more than 20 nm, each being described later. Further, it is preferred that the colloidal silica provides an alkaline colloidal silica solution as a colloid solution.

The necklace-shaped colloidal silica to be used in the invention is a generic term of an aqueous dispersion system of a spherical silica having a primary particle size of the order of nm. The necklace-shaped colloidal silica to be used in the invention means a "pearl necklace-shaped" colloidal silica formed by connecting spherical colloidal silica particles each having a primary particle size of from 10 to 50 μm so as to attain a length of from 50 to 400 nm. The term of "pearl necklace-shaped" means that the image of connected colloidal silica particles is like to the shape of a pearl necklace. The bonding between the silica particles forming the necklace-shaped colloidal silica is considered to be —Si—C—Si—, which is formed by dehydration of —SiOH groups located on the surface of the silica particles. Concrete examples of the necklace-shaped colloidal silica include Snowtex-PS series produced by Nissan Kagaku Kogyo, Co., Ltd.

As the products, there are Snowtex-PS-S (the average particle size in the connected state is approximately 110 nm), Snowtex-PS-M (the average particle size in the connected state is approximately 120 nm) and Snowtex-PS-L (the average particle size in the connected state is approximately 170 nm). Acidic colloidal silicas corresponding to each of the above-mentioned are Snowtex-PS-S-O, Snowtex-PS-M-O and Snowtex-PS-L-O, respectively.

The necklace-shaped colloidal silica is preferably used in a hydrophilic layer as a porosity providing material, and porosity and strength of the layer can be secured by its addition to the layer.

Among them, the use of Snowtex-PS-S, Snowtex-PS-M or Snowtex-PS-L, each being alkaline colloidal silica particles, is particularly preferable since the strength of the hydrophilic layer is increased and occurrence of background contamination is inhibited even when a lot of prints are printed.

It is known that the binding force of the colloidal silica particles is become larger with decrease of the particle size. The average particle size of the colloidal silica particles to be used in the invention is preferably not more than 20 nm, more preferably 1 to 20 nm, and most preferably 3 to 15 nm. As above-mentioned, the alkaline colloidal silica particles show the effect of inhibiting occurrence of the background contamination. Accordingly, the use of the alkaline colloidal silica particles is particularly preferable.

Examples of the alkaline colloidal silica particles having the average particle size within the foregoing range include Snowtex-20 (average particle size: 10 to 20 nm), Snowtex-30 (average particle size: 10 to 20 nm), Snowtex-40 (average particle size: 10 to 20 nm), Snowtex-N (average particle size: 10 to 20 nm), Snowtex-S (average particle size: 8 to 11 nm) and Snowtex-XS (average particle size: 4 to 6 nm), each produced by Nissan Kagaku Co., Ltd.

The colloidal silica particles having an average particle size of not more than 20 nm, when used together with the necklace-shaped colloidal silica as described above, is particularly preferred, since porosity of the layer is maintained and the layer strength is further increased.

The ratio of the colloidal silica particles having an average particle size of not more than 20 nm to the necklace-shaped colloidal silica is preferably from 95/5 to 5/95, more preferably from 70/30 to 20/80, and most preferably from 60/40 to 30/70.

The hydrophilic layer of the printing plate precursor of the invention contains porous metal oxide particles as metal oxides. Examples of the porous metal oxide particles include porous silica particles, porous aluminosilicate particles or zeolite particles as described later. Porous silica or porous aluminosilicate particles The porous silica particles are ordinarily produced by a wet method or a dry method. By the wet method, the porous silica particles can be obtained by drying and pulverizing a gel prepared by neutralizing an aqueous silicate solution, or pulverizing the precipitate formed by neutralization. By the dry method, the porous silica particles are prepared by combution of silicon tetrachloride together with hydrogen and oxygen to precipitate silica. The porosity and the particle size of such particles can be controlled by variation of the production conditions. The porous silica particles prepared from the gel by the wet method is particularly preferred.

The porous aluminosilicate particles can be prepared by the method described in, for example, JP O.P.I. No. 10-71764. Thus prepared aluminosilicate particles are amorphous complex particles synthesized by hydrolysis of aluminum alkoxide and silicon alkoxide as the major components. The particles can be synthesized so that the ratio of alumina to silica in the particles is within the range of from 1:4 to 4:1. Complex particles composed of three or more components prepared by an addition of another metal alkoxide may also be used in the invention. In such a particle, the porosity and the particle size can be controlled by adjustment of the production conditions.

The porosity of the particles is preferably not less than 1.0 ml/g, more preferably not less than 1.2 ml/g, and most preferably of from 1.8 to 2.5 ml/g, in terms of pare volume before the dispersion.

The pore volume is closely related to water retention of the coated layer. As the pore volume increases, the water retention is increased, contamination is difficult to occur, and the water retention latitude is broad. Particles having a pore volume of more than 2.5 ml/g are brittle, resulting in lowering of durability of the layer containing them. Particles having a pore volume of less than 1.0 ml/g are insufficient in minimizing contamination at printing and brittle, and in broadening the water retention latitude.

The preferable particle size is substantially not more than 1 $\mu$m, and more preferably not more than 0.5 $\mu$m, in the state contained in the hydrophilic layer (including the case in which the particles are subjected to the dispersing and pulverizing processes). When excessively larger particles exist, a porous and sharp projection is formed on the surface of the layer and ink tends to remain around the projection. As a result of that, contamination at the non-image portions or contamination of a blanket of a printing press tends to occur.

Zeolite Particles

Zeolite is a crystalline aluminosilicate, which is a porous material having voids of a regular three dimensional net work structure and having a pore size of 0.3 to 1 nm. Natural and synthetic zeolites are expressed by the following formula.

$$(M^1 \cdot (M^2)_{0.5})_m(Al_mSi_nO_{2(m+n)}).xH_2O$$

In the above, $M^1$ and $M^2$ are each exchangeable cations. Examples of $M^1$ include $Li^+$, $Na^+$, $K^+$, $Tl^+$, $Me_4N^+$(TMA), $Et_4N^+$(TEA), $Pr_4N^+$(TPA), $C_7H_{15}N^{2+}$, and $C_8H_{16}N^+$, and examples of $M^2$ include $Ca^{2+}$, $Mg^{2+}$, $Ba^{2+}$, $Sr^+$and $(C_8H_{18}N)_2^{2+}$. Relation of n and m is $n \geqq m$, and consequently, the ratio of m/n, or that of Al/Si is not more than 1. A higher Al/Si ratio shows a higher content of the exchangeable cation, and a higher polarity, resulting in higher hydrophilicity. The Al/Si ratio is within the range of preferably from 0.4 to 1.0, and more preferably 0.8 to 1.0. x is an integer.

Synthetic zeolite having a stable Al/Si ratio and a sharp particle size distribution is preferably used as the zeolite particles to he used in the invention. Examples of such zeolite include Zeolite, A: $Na_{12}(Al_{12}Si_{12}O_{48}).27H_2O$; Al/Si=1.0, Zeolite X: $Na_{86}$ $(Al_{86}Si_{106}O_{384}).264H_2O$; Al/Si= 0.811, and Zeolite Y: $Na_{56}$ $(Al_{56}Si_{136}O_{384}).250H_2O$; Al/Si= 0.412.

Containing the porous zeolite particles having an Al/Si ratio within the range of from 0.4 to 1.0 in the hydrophilic layer greatly raises the hydrophilicity of the hydrophilic layer itself, whereby contamination in the course of printing is inhibited and the water retention latitude is also increased. Further, contamination caused by a finger mark is also greatly reduced. When Al/Si is less than 0.4, the hydrophilicity is insufficient and the above-mentioned improving effects are lowered.

The particle size of the porous zeolite particles is preferably not more than 1 $\mu$m, and more preferably not more than 0.5 $\mu$m, in the state contained in the hydrophilic layer.

The hydrophilic layer of the printing plate precursor of the invention preferably contains layer structural clay mineral particles as a metal oxide. Examples of the layer structural clay mineral particles include a clay mineral such as kaolinite, halloysite, talk, smectite such as montmorillonite, beidellite, hectorite and saponite, vermiculite, mica and chlorite; hydrotalcite; and a layer structural polysilicate such as kanemite, makatite, ilerite, magadiite and kenyte. Among them, ones having a higher electric charge density of the unit layer are higher in the polarity and in the hydrophilicity. Preferable charge density is not less than 0.25, more preferably not less than 0.6. Examples of the layer structural mineral particles having such a charge density include smectite having a negative charge density of from 0.25 to 0.6 and bermiculite having a negative charge density of from 0.6 to 0.9. Synthesized fluorinated mica is preferable since one having a stable quality, such as the particle size, is available. Among the synthesized fluorinated mica, swellable one is preferable and one freely swellable is more preferable.

An intercalation compound of the foregoing layer structural mineral particles such as a pillared crystal, or one treated by an ion exchange treatment or a surface treatment such as a silane coupling treatment or a complication treatment with an organic binder is also usable.

With respect to the size of the flat plate-shaped layer structural mineral particles, the particles have an average particle size (an average of the largest particle length) of preferably not more than 20 $\mu$m, and more preferably not more than 10 $\mu$m, and an average aspect ratio (the largest particle length/the particle thickness of preferably not less than 20, and more preferably not less than 50, in a state contained in the layer including the case that the particles are subjected to a swelling process and a dispersing layer-separation process. When the particle size is within the foregoing range, continuity to the parallel direction, which is a trait of the layer structural particle, and softness, are given to the coated layer so that a strong dry layer in which a clack is difficult to be formed can be obtained. The coating solution containing the layer structural clay mineral particles in a large amount can minimize particle sedimentation due to a viscosity increasing effect. When the particle size is outside the foregoing range, the scratch inhibiting effect is lowered in some cases. The scratch inhibiting effect tends also to be lowered when the aspect ratio is lower than the foregoing range since the softness of the layer is become insufficient.

The content of the layer structural clay mineral particles is preferably from 0.1 to 30% by weight, and more preferably from 1 to 10% by weight based on the total weight of the layer. Particularly, the addition of the swellable synthesized fluorinated mica or smectite is effective if the adding amount is small. The layer structural clay mineral particles may be added in the form of powder to a coating liquid, but it is preferred that gel of the particles which is obtained by being swelled in water, is added to the coating liquid in order to obtain a good dispersity according to an easy coating liquid preparation method which requires no dispersion process comprising dispersion due to media.

An aqueous solution of a silicate is also usable as the carbon atom free materials to be added to the hydrophilic layer of the invention. An alkali metal silicate such as sodium silicate, potassium silicate or lithium silicate is preferable, and the $SiO_2/M_2O$ is preferably selected so that the pH value of the coating liquid after addition of the silicate exceeds 13 in order to prevent dissolution of the porous metal oxide particles or the colloidal silica particles.

An inorganic polymer or an inorganic-organic hybrid polymer prepared by a sol-gel method employing a metal alkoxide. Known methods described in S. Sakka "Application of Sol-Gel Method" or in the publications cited in the above publication can be applied to prepare the inorganic polymer or the inorganic-organic hybridpolymer by the sol-gel method.

Of these, a silica coat layer formed according to a sol-gel method employing tetraalkoxy silane does not contain a carbon atom. However, a silica coat layer formed according to a sol-gel method employing an alkoxysilane having alkyl, for example, alkoxytrialkoxy silane, contains residual alkyl. In the invention, a material containing the residual alkyl is regarded as a material containing a carbon atom.

In the invention, the hydrophilic layer can contain a carbon atom-containing material in an amount of less than 91% by weight, preferably less than 91% by weight.

Examples of the carbon atom-containing material include polyethylene oxide, polypropylene oxide, polyvinyl alcohol, polyethylene glycol (PEG), polyvinyl ether, a styrene-butadiene copolymer, a conjugation diene polymer latex of methyl methacrylate-butadiene copolymer, an acryl polymer latex, a vinyl polymer latex, polyacrylamide, and polyvinyl pyrrolidone.

A cationic resin may also be contained in the hydrophilic layer. Examples of the cationic resin include a polyalkylene-polyamine such as a polyethyleneamine or polypropylene-polyamine or its derivative, an acryl resin having a tertiary amino group or a quaternary ammonium group and diacrylamine. The cationic resin may be added in a form of fine particles. Examples of such particles include the cationic microgel described in Japanese Patent O.P.I. Publication No. 6-161101.

In the invention, it is preferred that the carbon atom-containing material contained in the hydrophilic layer is water soluble, and at least a part of the carbon atom-containing material exists in the hydrophilic layer in a state capable of being dissolved in water. If a water soluble carbon atom-containing material is cross-linked by a crosslinking agent and is insoluble in water, its hydrophilicity is lowered, resulting in problem of lowering printing performance.

In the invention, a saccharide is preferable as a water soluble carbon atom-containing material preferably contained in the hydrophilic layer. The saccharide in the hydrophilic layer improves resolution of a formed image and printing durability in combination with a functional layer capable of forming an image, which is described later.

As the saccharide, an oligosaccharide, which is detailed later, is used, but a polysaccharide is preferably used.

As the polysaccharide, starches, celluloses, polyuronic acid and pullulan can be used. Among them, a cellulose derivative such as a methyl cellulose salt, a carboxymethyl cellulose salt or a hydroxyethyl cellulose salt is preferable, and a sodium or ammonium salt of carboxymethyl cellulose is more preferable.

These polysaccharides can form a preferred surface shape of the hydrophilic layer.

The surface of the hydrophilic layer preferably has an uneven structure having a pitch of from 0.1 to 50 $\mu$m such as the grained aluminum surface of an aluminum PS plate. The water retention ability and the image maintaining ability are raised by the unevenness of the surface.

Such an uneven structure can also be formed by adding in an appropriate amount a filler having a suitable particle size to the coating liquid of the hydrophilic layer. However, the uneven structure is preferably formed by coating a coating liquid for the hydrophilic layer containing the alkaline colloidal silica and the water-soluble polysaccharide so that the phase separation occurs at the time of drying the coated liquid in obtaining a structure providing a good printing performance.

The shape of the uneven structure such as the pitch and the surface roughness thereof can be suitably controlled by the kinds and the adding amount of the alkaline colloidal silica particles, the kinds and the adding amount of the water-soluble polysaccharide, the kinds and the adding amount of another additive, a solid concentration of the coating liquid, a wet layer thickness or a drying condition.

The pitch of the uneven structure is preferably from 0.2 to 30 $\mu$m, and more preferably from 0.5 to 20 $\mu$m. A double uneven structure may be formed, in which an uneven structure having a smaller pitch is formed on an uneven structure having a larger pitch.

The surface roughness Ra is preferably from 100 to 1,000 nm, more preferably from 150 to 600 nm.

The thickness of the hydrophilic layer is preferably 0.01 to 50 $\mu$m, more preferably 0.2 to 10 $\mu$m, and most preferably 0.5 to 3 $\mu$m.

A water-soluble surfactant may be added for improving the coating ability of the coating liquid for the hydrophilic layer in the invention. A silicon atom-containing surfactant and a fluorine atom-containing surfactant are preferably used. The silicon atom-containing surfactant is especially preferred in that it minimizes printing contamination. The content of the surfactant is preferably from 0.01 to 3% by weight, and more preferably from 0.03 to 1% by weight based on the total weight of the hydrophilic layer (or the solid content of the coating liquid).

The hydrophilic layer in the invention can contain a phosphate. Sine a coating liquid for the hydrophilic layer is preferably alkaline, the phosphate to be added to the hydrophilic layer is preferably sodium phosphate or sodium monohydrogen phosphate. The addition of the phosphate provides improved reproduction of dots at shadow portions. The content of the phosphate is preferably from 0.1 to 5% by weight, and more preferably from 0.5 to 2% by weight in terms of amount excluding hydrated water.

The hydrophilic layer in the invention can contain a light heat conversion material. Examples of the light heat conversion material include the following substances:

Examples of the light-heat conversion material include a general infrared dye such as a cyanine dye, a chloconium dye, a polymethine dye, an azulenium dye, a squalenium dye, a thiopyrylium dye, a naphthoquinone dye or an anthraquinone dye, and an organometallic complex such as a phthalocyanine compound, a naphthalocyanine compound, an azo compound, a thioamide compound, a dithiol compound or an indoaniline compound. Exemplarily, the light-heat conversion materials include compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds may be used singly or in combination.

Examples of pigment include carbon, graphite, a metal and a metal oxide. Furnace black and acetylene black is preferably used as the carbon. The graininess (d50) thereof is preferably not more than 100 nm, and more preferably not more than 50 nm. The graphite is one having a particle size of preferably not more than 0.5 μm, more preferably not more than 100 nm, and most preferably not more than 50 nm.

As the metal, any metal can be used as long as the metal is in a form of fine particles having preferably a particle size of not more than 0.5 μm, more preferably not more than 100 nm, and most preferably not more than 50 nm. The metal may have any shape such as spherical, flaky and needle-like. Colloidal metal particles such as those of silver or gold are particularly preferred.

As the metal oxide, materials having black color in the visible regions or materials which are electro-conductive or semi-conductive can be used.

Examples of the former include black iron oxide ($Fe_3O_4$), and black complex metal oxides containing at least two metals.

Examples of the latter include Sb-doped $SnO_2$ (ATO), Sn-added $In_2O_3$ (ITO), $TiO_2$, TiO prepared by reducing $TiO_2$ (titanium oxide nitride, generally titanium black). Particles prepared by covering a core material such as $BaSO_4$, $TiO_2$, $9Al_2O_3.2B_2O$ and $K_2O.nTiO_2$ with these metal oxides is usable. The particle size of these particles is preferably not more than 0.5 μm, more preferably not more than 100 nm, and most preferably not more than 50 nm.

Of these light heat conversion materials, a material having a carbon atom can be contained in the hydrophilic layer in an amount of less than 9% by weight, and more preferably less than 5% by weight. However, the light heat conversion material is preferably a metal or a metal oxide.

As described above, the especially preferred light heat conversion materials are as follows:

(a) a light heat conversion materials which does not substantially change in its nature in an oxidation atmosphere at 400° C., (b) the metal oxide, the metal oxides being complex metal oxides containing at least two metals, the complex metal oxides comprising at least two selected from Al, Ti, Cr, Mn, Fe, Co, Ni, Cu, Zn, Sb, and Ba, the complex metal oxides being preferably Cu—Cr—Mn type complex metal oxides or Cu—Fe—Mn type complex metal oxides, (c) a light heat conversion material having an average primary particle size of preferably not more than 1 μm, and more preferably 0.01 to 0.5 μm, or (d) a light heat conversion material having been treated in an oxidation atmosphere at 400° C. in its manufacture.

Another embodiment of the printing plate precursor of the invention is a printing plate precursor comprising a substrate and a functional layer capable forming an image. As one example of the printing plate precursor of the invention comprising a layer containing a light heat conversion material, there is a printing plate precursor comprising a functional layer provided on the layer containing a light heat conversion material is shown in Table 1 described previously. In the printing plate precursor of the invention comprising a hydrophilic layer on a substrate, a functional layer capable of forming an image may be provided on the hydrophilic layer or under the hydrophilic layer (or between the hydrophilic layer and the substrate). When the functional layer is provided under the hydrophilic layer, it is preferred that the light heat conversion material is contained in the functional layer and not in the hydrophilic layer.

An image formation on the printing plate precursor of the invention is carried out by applying heat and preferably by infrared ray exposure.

Exposure applied in the invention is preferably scanning exposure, which is carried out employing a laser which can emit light having a wavelength of infrared and/or near-infrared regions, that is, a wavelength of from 700 to 1500 nm. As the laser, a gas laser can be used, but a semi-conductor laser, which emits light having a near-infrared region wavelength, is preferably used.

A device suitable for the scanning exposure in the invention may be any device capable of forming an image on the printing plate precursor according to image signals from a computer employing a semi-conductor laser.

Generally, the scanning exposures include the following processes.

(1) a process in which a plate precursor provided on a fixed horizontal plate is scanning exposed in two dimensions, employing one or several laser beams.

(2) a process in which the surface of a plate precursor provided along the inner peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

(3) a process in which the surface of a plate precursor provided along the outer peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

In the invention, the process (3) above is preferable, and especially preferable when a printing plate precursor mounted on a plate cylinder of a printing press is scanning exposed. As the process (3), a process as disclosed in, for example, Japanese Patent Q.P.I. Publication No. 5-131676, can be used. Plural semi-conductor lasers are arranged in one line in the sub-scanning direction at a certain beam pitch, or plural semi-conductor lasers are arranged at a certain beam pitch in the sub-scanning direction and at certain intervals in the main scanning direction, that is, in two dimensions. The spot size of plural laser beams emitted from these semi-conductor lasers are reduced through an optical system comprising an optical fiber, a lens or a mirror so that the laser beams are focused on the plate precursor surface, and accordingly, the surface of the plate precursor is exposed with the reduced beam spots so as to give a predetermined exposure dissolving power. When the semi-conductor lasers are arranged in two dimensions, exposure of the plate precursor surface to the reduced beam spots is also carried out in two dimensions, and therefore, emission of each laser located in the main scanning direction is required to be delayed according to a generated image signal.

The sub-scanning of the laser light is generally carried out by moving an exposure head in the direction parallel to the rotational drum axis by a distance equal to a laser spot size multiplied by the laser beam number per one rotation of the drum. The exposure head may move at a constant speed from the beginning of the exposure till completion thereof, while controlled through a standard signal generated by rotation of the drum, that is, a spiral exposure may be carried out. The exposure head, when passing the part (generally, between the both ends of the plate precursor) on the drum at which the plate precursor is not present, may intermittently move by a predetermined distance. Further, a method as is disclosed in JPA-11-133620 may be used, which comprises a system countering a tendency for the laser beam to incline in the sub-scanning direction, while conducting spiral exposure.

FIG. 1 shows a schematic view of one embodiment of a scanning exposure device comprising n semi-conductor laser sources. The exposure device comprises a rotational drum 2 and an exposure head 1 connected to a moving member 4 for moving the exposure head in the sub-scanning which can move exposure head in the direction parallel to the rotational axis of rotational drum 2, that is, in the sub-scanning direction (shown by an arrow "Y" in FIG. 1). An arrow "X" in FIG. 1 shows the main scanning direction. The exposure head comprises n semi-conductor laser sources LD1 through LDn and an optical system 1*a* which makes it possible to expose the surface of a printing plate precursor 3 to each laser beam of a predetermined beam spot size at a predetermined position relationship. A laser source operation signal generating circuit 6 receives both an image signal from a computer 7 and a standard signal generated by a standard signal generating circuit 8, in response to rotation of the drum, and generates a laser source operation signal. A laser source operation circuit 5 receives the laser source operation signal and operates each of the semi-conductor laser sources LD1 through LDn, separately, whereby the surface of printing plate precursor 3 is imagewise scanning exposed. Numerical number 3*a* shows exposed portions on the printing plate precursor 3. Moving member 4 also receives the standard signal and moves the exposure head in the sub-scanning direction by a given distance (by n dots) per one rotation of the rotational drum 2. As described above, this movement may be carried out at a constant speed from the beginning of the exposure till completion thereof, and the exposure head, when passing the portion 2*a* on the drum at which the plate precursor is not present, may intermittently move by a predetermined distance.

In the printing plate precursor of the invention comprising a hydrophilic layer, an image can be formed by imagewise providing a lipophilic material directly on the surface of the hydrophilic layer.

As one of the methods of imagewise providing the lipophilic material, there is a method of employing a known thermal transfer process. For example, there is a method of imagwise transferring a heat fusible ink of an ink ribbon having a heat fusible ink layer onto the surface of the hydrophilic layer employing a thermal head.

There is also a method of mounting the printing plate precursor on an exposure drum of a digital proof apparatus employing an infrared laser heat fusion transfer process, with the hydrophilic layer outwardly, further providing an ink sheet having an ink layer on the hydrophilic layer so that the ink layer contacts the hydrophilic layer, and then imagewise exposing the ink sheet by infrared laser to imagewise transfer a heat fusible ink of the ink layer onto the surface of the hydrophilic layer. In this case, a light heat conversion material may be contained in the hydrophilic layer of the printing plate precursor, in the ink sheet, or in both hydrophilic layer and ink sheet.

An image, which has been formed on the hydrophilic layer of the printing plate precursor employing a heat fusible ink, can be more firmly adhered to the hydrophilic layer by heating the printing plate precursor. When the hydrophilic layer contains a light heat conversion material, the heating can be carried out employing an infrared laser exposure or a flush exposure such as a xenon lamp exposure.

As another method of imagewise providing the lipophilic material, there is a method of employing a known ink jet process. In this case, inks used include a lipophilic ink disclosed in Japanese Patent Publication No. 2995075, a hot melt ink disclosed in Japanese Patent O.P.I. Publication No. 10-24550, a lipophilic ink, in which hydrophobic resin particles being a solid at ordinary temperature are dispersed, disclosed in Japanese Patent O.P.I. Publication No. 10-157053, and an aqueous ink, in which hydrophobic thermoplastic resin particles being a solid at ordinary temperature are dispersed.

When ink contains thermoplastic resin, an image, which has been formed on the hydrophilic layer of the printing plate precursor employing the ink, can be more firmly adhered to the hydrophilic layer by heating the printing plate precursor. When the hydrophilic layer contains a light heat conversion material, the heating can be carried out employing an infrared laser exposure or a flush exposure such as a xenon lamp exposure.

One preferred example of the printing plate precursor of the invention is a printing plate precursor comprising a substrate, and provided thereon, a layer being ablated by heat, the hydrophilic layer in the invention, and a layer containing a water soluble material, particularly a saccharide, in that order. In this example, it is preferred that the substrate surface and/or the heat ablated layer surface are lipophilic. The heat ablated layer is not limited, as long as it is heated by infrared laser exposure, resulting in ablation of at least the surface and/or a part of the heat ablated layer. For example, there is a metal film disclosed in Japanese Patent Publication No. 2735508. In an ablation type printing plate precursor, the use of the hydrophilic layer in the invention provides both good printing performance and good resolution.

Particularly in this example, the surface of the hydrophilic layer has an uneven structure having a pitch of preferably from 0.1 to 50 $\mu$m as the grained aluminum surface of an aluminum PS plate described above, and more preferably from 0.1 to 5 $\mu$m. The hydrophilic layer of the printing plate precursor of the invention contains not less than 91% by weight of a carbon atom free material and preferably not less than 91% by weight of a metal oxide, which provides a layer easily subjected to brittle fracture. Further, the regularity of the pitch easily causes separation of the hydrophilic layer along the pitch due to ablation, and greatly improves image fringe and dot quality, which is poor in a conventional ablation type printing plate precursor.

Provision of a layer containing a water soluble material, particularly a saccharide as a protective layer, an outermost layer of the printing plate precursor can prevent an ablated hydrophilic layer at image portions from scattering, and can minimize contamination of an exposure device. The protective layer is water soluble, and can be removed together with the ablated hydrophilic layer by washing with water, however, since a protective layer containing a saccharide is rapidly dissolved in water, the layer can be removed on the printing press employing dampening water.

Removal of the protective layer of the printing plate precursor on the press is carried out rotating the plate cylinder, on which the printing plate precursor is mounted, to bring an ink roller or a dampening water supply roller into contact with the layer. However, removal of the protective layer does not require a specific system, and can be carried out conducting the same manner as in the beginning of printing of a conventional PS plate, which does not increase loss of prints at the beginning of printing.

Use of the saccharide does not lower hydrophilicity of the hydrophilic layer and can maintain good printing performance of the hydrophilic layer. As the saccharide polysaccharide is preferably used. As the polysaccharide, starches, celluloses, polyuronic acid and pullulan can be used. Among them, a cellulose derivative such as a methyl cellulose salt, a carboxymethyl cellulose salt or a hydroxyethyl cellulose salt is preferable, and a sodium or ammonium salt of carboxymethyl cellulose is more preferable.

Another one preferred example of the printing plate precursor of the invention is a printing plate precursor comprising a substrate, and provided thereon, the hydrophilic layer in the invention, and a layer containing heat fusible particles or thermoplastic particles, in that order, it is preferred that the layer containing heat fusible particles or thermoplastic particles further contains a water soluble material. As the water soluble material, saccharide is preferred. In this example, an image is formed by imagewise heating the surface of the printing plate precursor. Portions of the saccharide-containing layer, exposed by for example, a near-infrared laser and/or an infrared laser, change to lipophilic image portions, and unexposed portions of the layer are removed to form non-image portions. In this case, formation of the lipophilic portions results from permeation of the heat fusible particles into the porous hydrophilic layer and/or fusion adhesion of the thermoplastic particles to the hydrophilic layer.

Removal of the unexposed portions of the saccharide-containing layer can be carried out dissolving the saccharide in water. However, since the saccharide-containing layer is easily dissolved in water, the removal can be carried out on a press employing dampening water.

Removal of the saccharide-containing layer of the printing plate precursor on the press is carried out rotating the plate cylinder, on which the printing plate precursor is mounted, to bring an ink roller or a dampening water supply roller into contact with the layer. However, removal of the saccharide-containing layer does not require a specific system, and can be carried out conducting the same manner as in the beginning of printing of a conventional PS plate, which does not increase loss of prints at the beginning of printing.

Use of the saccharide does not lower hydrophilicity of the hydrophilic layer and can maintain good printing performance of the hydrophilic layer. As the saccharide used in this example, oligosaccharide is preferably used. Use of the oligosaccharide does not inhibit the image formation in this example resulting from permeation of the heat fusible particles into the porous hydrophilic layer and/or fusion adhesion of the thermoplastic particles to the hydrophilic layer, and easily removes the unexposed portions of the layer.

The oligosaccharide is a water-soluble crystalline substance generally having a sweet taste, which is formed by a dehydration condensation reaction of plural monosaccharide molecules. The oligosaccharide is one kind of o-glycoside having a saccharide as the aglycon. The oligosaccharide is easily hydrolyzed by an acid to form a monosaccharide, and is classified according to the number of monosaccharide molecules of the resulting hydrolysis compounds, for example, into disaccharide, trisaccharide, tetrasaccharide, and pentasscharide. The oligosaccharide referred to in the invention means di- to deca-saccharides.

The oligosaccharide is classified into a reducing oligosaccharide and a non-reducing oligosaccharide according to presence or absence of a reducing group in the molecule. The oligosaccharide is also classified into a homo-oligosaccharide composed of the same kind of monosaccharide and a hetero-oligosaccharide composed of two or more kinds of monosaccharides.

The oligosaccharide naturally exists in a free state or a glycoside state. Moreover, various oligosaccharides are formed by glycosyl transition by action of an enzyme.

The oligosaccharide frequently exists in a hydrated state in an ordinary atmosphere. The melting points of the hydrated one and anhydrous one are different from each other as shown in the following Table 2.

TABLE 2

| Kinds of oligosaccharide | | Melting point (° C.) Hydrates | Anhydrides |
|---|---|---|---|
| Raffinose | Trisaccharide | 80 (Pentahydrate) | 118 |
| Trehalose | Disaccharide | 97 (Dihydrate) | 215 |
| Maltose | Disaccharide | 103 (Monohydrate) | 108 |
| Galactose | Disaccharide | 119 (Monohydrate) | 167 |
| Sucrose | Disaccharide | None | 182 |
| Lactose | Disaccharide | 201 (Monohydrate) | 252 |

In the invention, the layer containing a saccharide is preferably formed coating an aqueous coating solution containing the saccharide on a support. When an oligossccharide in the layer formed from the aqueous coating solution is one capable of forming a hydrate, the melting point of the oligosaccharide is that of its hydrate.

Among the oligosaccharides, trehalose with comparatively high purity is available on the market, and has an extremely low hygroscopicity, although it has high water solubility, providing excellent storage stability and excellent development property on a printing press.

When oligosaccharide hydrates are heat melted to remove the hydrate water and solidified, the oligosaccharide is in a form of anhydride for a short period after solidification. Trehalose is characterized in that a melting point of trehalose anhydride is not less than 100° C. higher that that of trehalose hydrate. This characteristics provides a high melting point and reduced heat fusibility at exposed portions of the trehalose-containing layer immediately after heat-fused by infrared ray exposure and re-solidified, preventing image defects at exposure such as banding from occurring. In order to attain the object of the invention, trehalose is preferable among oligosaccharides. The oligosaccharide content of the layer is preferably from 1 to 90% by weight, and more preferably from 10 to 80% by weight, based on the total weight of the layer.

The heat fusible particles used in the invention are particularly particles having a low melt viscosity, or particles formed from materials generally classified into wax. The materials preferably have a softening point of from 40° C. to 120° C. and a melting point of from 60° C. to 150° C., and more preferably a softening point of from 40° C. to 100° C. and a melting point of from 60° C. to 120° C. The melting point less than 60° C. has a problem in storage stability and the melting point exceeding 300° C. lowers ink receptive sensitivity.

Materials usable include paraffin, polyolefin, polyethylene wax, microcrystalline wax, and fatty acid wax. The molecular weight thereof is approximately from 800 to 10,000. A polar group such as a hydroxyl group, an ester group, a carboxyl group, an aldehyde group and a peroxide group may be introduced into the wax by oxidation to increase the emulsification ability. Moreover, stearoamide, linolenamide, laurylamide, myristylamide, hardened cattle fatty acid amide, parmitylamide, oleylamide, rice bran oil fatty acid amide, palm oil fatty acid amide, a methylol compound of the above-mentioned amide compounds, methylenebissteastearoamide and ethylenebissteastearoamide may be added to the wax to lower the softening point or to raise the working efficiency. A cumarone-indene resin, a rosin-modified phenol resin, a terpene-modified phenol resin, a xylene resin, a ketone resin, an acryl resin, an ionomer and a copolymer of these resins may also be usable.

Among them, polyethylene, microcrystalline wax, fatty acid ester and fatty acid are preferably contained. A high sensitive image formation can be performed since these materials each have a relative low melting point and a low melt viscosity. These materials each have a lubrication ability. Accordingly, even when a shearing force is applied to the surface layer of the printing plate precursor, the layer damage is minimized, and resistance to contaminations which may be caused by scratch is further enhanced.

The heat fusible particles are preferably dispersible in water. The average particle size thereof is preferably from 0.01 to 10 μm, and more preferably from 0.1 to 3 μm. When a layer containing the heat fusible particles is coated on the porous hydrophilic layer, the particles having an average particle size less than 0.01 μm may enter the pores of the hydrophilic layer or the valleys between the neighboring two peaks on the hydrophilic layer surface, resulting in insufficient on press development and background contaminations. The particles having an average particle size exceeding 10 μm may result in lowering of dissolving power.

The composition of the heat fusible particles may be continuously varied from the interior to the surface of the particles. The particles may be covered with a different material.

Known microcapsule production method or sol-gel method can be applied for covering the particles. The heat fusible particle content of the layer is preferably 1 to 90% by weight, and more preferably 5 to 80% by weight based on the total layer weight.

The thermoplastic particles in the invention include thermoplastic hydrophobic polymer particles. Although there is no specific limitation to the upper limit of the softening point of the thermoplastic hydrophobic polymer particles, the softening point is preferably lower than the decomposition temperature of the polymer particles. The weight average molecular weight (Mw) of the polymer is preferably within the range of from 10,000 to 1,000,000.

Examples of the polymer consisting the polymer particles include a diene (co)polymer such as polypropylene, polybutadiene, polyisoprene or an ethylene-butadiene copolymer; a synthetic rubber such as a styrene-butadiene copolymer, a methyl methacrylate-butadiene copolymer or an acrylonitrile-butadiene copolymer; a (meth)acrylate (co) polymer or a (meth)acrylic acid (co)polymer such as polymethyl methacrylate, a methyl methacrylate-(2-ethylhexyl) acrylate copolymer, a methyl methacrylate-methacrylic acid copolymer, or a methyl acrylate-(N-methylolacrylamide); polyacrylonitrile; a vinyl ester (co)polymer such as a polyvinyl acetate, a vinyl acetate-vinyl propionate copolymer and a vinyl acetate-ethylene copolymer, or a vinyl acetate-2-hexylethyl acrylate copolymer; and polyvinyl chloride, polyvinylidene chloride, polystyrene and a copolymer thereof. Among them, the (meth)acrylate polymer, the (meth)acrylic acid (co)polymer, the vinyl ester (co)polymer, the polystyrene and the synthetic rubbers are preferably used.

The polymer particles may be prepared from a polymer synthesized by any known method such as an emulsion polymerization method, a suspension polymerization method, a solution polymerization method and a gas phase polymerization method. The particles of the polymer synthesized by the solution polymerization method or the gas phase polymerization method can be produced by a method in which an organic solution of the polymer is sprayed into an inactive gas and dried, and a method in which the polymer is dissolved in a water-immiscible solvent, then the resulting solution is dispersed in water or an aqueous medium and the solvent is removed by distillation. In both of the methods, a surfactant such as sodium lauryl sulfate, sodium dodecylbenzenesulfate or polyethylene glycol, or a water-soluble resin such as poly(vinyl alcohol) may be optionally used as a dispersing agent or stabilizing agent.

The thermoplastic particles are preferably dispersible in water. The average particle size of the thermoplastic particles is preferably from 0.01 to 10 μm, and more preferably from 0.1 to 3 μm. When a layer containing the thermoplastic particles having an average particle size less than 0.01 μm is coated on the porous hydrophilic layer, the particles may enter the pores of the hydrophilic layer or the valleys between the neighboring two peaks on the hydrophilic layer surface, resulting in insufficient on press development and background contaminations. The thermoplastic particles having an average particle size exceeding 10 μm may result in lowering of dissolving power.

Further, the composition of the thermoplastic particles may be continuously varied from the interior to the surface of the particles. The particles may be covered with a different material. As a covering method, known methods such as a microcapsule method and a sol-gel method are usable. The thermoplastic particle content of the layer is preferably from 1 to 90% by weight, and more preferably from 5 to 80% by weight based on the total weight of the layer.

The coating amount of the layer containing a saccharide in this example of the printing plate precursor is from 0.01 to 10 $g/m^2$, preferably from 0.1 to 3 $g/m^2$, and more preferably from 0.2 to 2 $g/m^2$.

Known materials used as the substrate of a conventional printing plate can be used as the substrate of the printing plate precursor according to the invention. Examples of the substrate include a metal plate, a plastic film, paper treated with a polyolefin and a composite substrate formed by laminating the foregoing materials. The thickness of the substrate is not specifically limited as long as the substrate can be mounted on a printing machine, and a substrate having a thickness of from 50 to 500 μm is suitable for easy handling.

As the metal plate, iron, stainless steel and aluminum are usable, and aluminum is preferred from the viewpoint of the specific gravity and the stiffness thereof. The aluminum plate is usually used after the degreasing by an alkali or an acid for removing the oil adhered on the surface at the time of rolling and winding. The degreasing treatment by an alkali solution is preferred. Moreover, it is preferable to apply an adhesion ability increasing treatment of a subbing layer coating to raise the adhesiveness of the surface to the coated layer. In an example of such a method, the plate is immersed in a liquid containing a silicate or a coupling agent such as a silane coupling agent or coated with such the liquid and sufficiently dried. An anodized treatment is also usable which is considered as one kind of the adhesion ability increasing treatment. The anodizing treatment and the immersing or coating treatment may be applicable in combination. An aluminum plate roughened by a known method is also usable.

Examples of the plastic film include that of a polytethylene terephthalate), a poly(ethylene naphthalate), a polyimide, a polyamide, a polycarbonate, a polysulfon, a poly(phenylene oxide) and a cellulose ester. The poly (ethylene terephthalate) and poly(ethylene naphthalate) are particularly preferred. It is preferable that the surface of these plastic films on which the layer is to be coated is subjected to the adhesion ability increasing treatment or the subbing layer coating for raising the adhesion ability between the plastic film and the coated layer. Examples of the adhesion ability increasing treatment include a treatment by corona discharge, flame, plasma or UV irradiation. Examples of the subbing layer include a layer of gelatin and a layer containing a latex. A water-penetration preventing layer such as a poly(vinylidene chloride) layer as the subbing layer. Moreover, the water-penetration preventing layer formed by evaporation of aluminum or silicon may be provided, and a subbing layer may be provided on the evaporated layer of aluminum or silicon.

The composite substrate is prepared by optionally laminating the foregoing materials, and the lamination may be carried out before or after the formation of the hydrophilic layer and just before attaching on the printing machine.

The printing method of the invention comprises forming an image on the printing plate precursor of the invention, and supplying dampening water containing an alcohol in an amount of not mote than 5% by weight to the resulting plate precursor, whereby then printing is carried out.

The printing plate precursor of the invention comprising extremely highly hydrophilic layer is difficult to produce contamination in printing such as background contamination, and therefore, makes it possible to print employing dampening water containing an alcohol such as isopropanol in an amount of not mote than 5% by weight. Further, the printing plate precursor does not produce the background contamination in printing employing dampening water which does not substantially contain an alcohol, which greatly improves the working environment of printing.

The printing plate precursor of the invention does not require a specific development, and can be applied to so-called a direct imaging printing press installed with installed with an image forming system such as infrared laser exposure process, thermal transfer process, or ink jet process. In such a direct imaging printing press, the printing plate precursor makes it to print employing dampening water containing an alcohol in an amount of not mote than 5% by weight or dampening water, which does not substantially contain an alcohol. This shows that the direct imaging printing press can be established in an office without any specific exhauster.

EXAMPLES

<Substrate>

Substrate 1

A subbing layer comprised of two layers was coated on a 0.18 mm thick PET film according to the following procedures to obtain a substrate 1.

1) First Subbing Layer

The surface of the PET film was corona discharged, and the following coating solution was coated onto the discharged surface by a wire bar at 20° C. and 55% RH to obtain a first subbing layer with a dry thickness of 0.4 μm, and dried at 140° C. for 2 minutes.

(Composition of First Subbing Layer Coating Solution)

| | |
|---|---|
| Acryl latex particles (n-butyl acrylate/t-butyl acrylate/styrene/hydroxyethyl methacrylate (=28/22/25/25) copolymer) | 36.9 g |
| Surfactant (A) | 0.36 g |
| Hardener (a) | 0.98 g |

Distilled water was added to the above composition to make 1,000 ml to obtain a first subbing layer coating solution.

2) Second Subbing Layer

The surface of the first subbing layer was corona discharged, and the following coating solution was coated onto the discharged surface by an air knife method at 35° C. and 22% RH to obtain a second subbing layer with a dry thickness of 0.1 μm, and dried at 140° C. for 2 minutes. (Thus, a support was obtained.)

(Composition of Second Subbing Layer Coating Solution)

| | |
|---|---|
| Gelatin | 9.6 g |
| Surfactant (A) | 0.4 g |
| Hardener (b) | 0.1 g |

Distilled water was added to the above composition to make 1,000 ml to obtain a second subbing layer coating solution.

Surfactant (A)

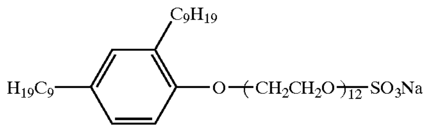

Hardener (a)

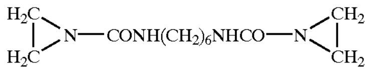

Hardener (b)

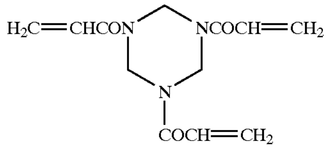

Substrate 2

A 50 μm thick PET film (HS74 produced by Teijin Co., Ltd.) with a subbing layer for an aqueous coating liquid was employed as substrate 2.

Substrate 3

A 0.24 mm thick aluminum plate (AA1050) was degreased with an aqueous sodium hydroxide solution, wherein the aluminum dissolution amount was 2 g/$m^2$. The resulting aluminum plate was sufficiently washed with pure water, immersed in a 1% by weight sodium dihydrogen phosphate aqueous solution at 70° C. for 30 seconds, then sufficiently washed with pure water, and dried to obtain substrate 3.

Example 1 a. Preparation of Printing Plate Precursor Sample

Preparation of Printing Plate Precursor Sample 11

A hydrophilic layer coating solution of the following composition containing a light heat conversion material was prepared, filtered, then coated on the above obtained substrate 1 by a #10 wire bar, and dried at 80° C. for 5 minutes.

The aqueous dispersion of Cu—Cr—Mn type metal oxide black pigment, which was employed a light heat conversion material, was dried to obtain a solid pigment, and then heated in a 400° C. oven for 10 minutes, but the pigment did not substantially change after that heating.

[A Composition of a Hydrophilic Layer Coating Solution Containing a Light Heat Conversion Material]

| | |
|---|---|
| Colloidal silica (alkali type) Snowtex S (solid 30% by weight, produced by Nissan Kagaku Co., Ltd.) | 25.0 parts by weight |
| Necklace shaped colloidal silica (alkali type) Snowtex PSM (solid 20% by weight, produced by Nissan Kagaku Co., Ltd.) | 55.0 parts by weight |
| Porous metal oxide particles Silton AMT 08 (porous aluminosilicate particles having an average particle size of 0.6 μm, produced by Mizusawa Kagaku Co., Ltd.) | 5.0 parts by weight |
| Cu—Cr—Mn type metal oxide black pigment: MF-5568 black aqueous dispersion {(produced by Dainichi Seika Kogyo Co., Ltd., pigment having a particle size of 0.5 to 1 μm, a solid content of 50.5% by weight (including 0.5% by weight of dispersant)} | 11.0 parts by weight |

Deionized water was added to the above composition to give a solid content of 20% by weight, and sufficiently mixed with stirring employing a homogenizer.

The resulting material was aged at 55° C. for 24 hours to obtain a printing plate precursor sample 11.

Preparation of Printing Plate Precursor Sample 12

Cu—Cr—Mn type metal oxide black pigment: MF-3550 black powder produced by Dainichi Seika Kogyo Co., Ltd. and a silicon atom-containing surfactant FZ2161 produced by Nippon Unicar Co., Ltd. as a dispersant is dispersed in a sand grinder containing a zirconia beads having a particle diameter of 0.5 mm to obtain an aqueous dispersion having a solid content of 40.5% by weight (including 0.5% by weight of the dispersant). The Cu—Cr—Mn type metal oxide black pigment powder did not substantially change in nature after heated in a 400° C. oven for 10 minutes.

A hydrophilic layer coating solution of the following composition containing a light heat conversion material was prepared, employing the aqueous dispersion obtained above. A printing plate precursor sample 12 was prepared in the same manner as printing plate precursor sample 11, except that the resulting hydrophilic layer coating solution was used.

The dry thickness of the layer was adjusted so as to give substantially the same absorbance at 830 nm as that of the printing plate precursor sample 11.

[A Composition of a Hydrophilic Layer Coating Solution Containing a Light Heat Conversion Material]

| | |
|---|---|
| Colloidal silica (alkali type) Snowtex S (solid content 30% by weight, produced by Nissan Kagaku Co., Ltd.) | 25.0 parts by weight |
| Necklace shaped colloidal silica (alkali type) Snowtex PSM (solid content 20% by weight, produced by Nissan Kagaku Co., Ltd.) | 55.0 parts by weight |
| Porous metal oxide particles Silton AMT 08 (porous aluminosilicate particles having an average particle size of 0.6 μm, produced by Mizusawa Kagaku Co., Ltd.) | 5.0 parts by weight |
| Cu—Fe—Mn type metal oxide black pigment: TM-3550 black aqueous dispersion {prepared by dispersing TM-3550 black powder having a particle size of 0.1 μm produced by Dainichi Seika Kogyo Co., Ltd. in water to give a solid content of 40.5% by weight (including 0.5% by weight of dispersant)} | 6.0 parts by weight |

Deionized water was added to the above composition to give a solid content of 20% by weight, and sufficiently mixed with stirring employing a homogenizer.

Preparation of Printing Plate Precursor Sample 13

Cu—Cr—Mn type metal oxide black pigment: MF-3550 black powder produced by Dainichi Seika Kogyo Co., Ltd. used as a light heat conversion material was heated in a 450° C. oven for 10 minutes, and cooled, but any substantial change in nature was not observed in the resulting pigment. A printing plate precursor sample 13 was prepared in the same manner as printing plate precursor sample 12, except that the resulting pigment was used.

Preparation of Comparative Printing Plate Precursor Sample 14

A comparative printing plate precursor sample 14 was prepared in the same manner as printing plate precursor sample 11, except that the following hydrophilic layer coating solution containing a light heat conversion material was used. The dry thickness of the hydrophilic layer was adjusted so as to give substantially the same absorbance at 830 nm as that of the printing plate precursor sample 11.

The aqueous dispersion containing carbon black pigment used as a light heat conversion material was dried to obtain a solid carbon black, and when the solid carbon black was heated in a 400° C. oven for 10 minutes, the carbon black burned out.

[A Composition of a Hydrophilic Layer Coating Solution Containing a Light Heat Conversion Material]

| | |
|---|---|
| Colloidal silica (alkali type) Snowtex S (solid content 30% by weight, produced by Nissan Kagaku Co., Ltd.) | 25.0 parts by weight |
| Necklace shaped colloidal silica (alkali type) Snowtex PSM (solid content 20% by weight, produced by Nissan Kagaku Co., Ltd.) | 55.0 parts by weight |
| Porous metal oxide particles Silton AMT 08 (porous aluminosilicate particles having an average particle size of 0.6 μm, produced by Mizusawa Kagaku Co., Ltd.) | 5.0 parts by weight |
| Carbon black aqueous dispersion SD9020 (Solid content of 30% by weight, produced by Dainippon Ink Co., Ltd.) | 7.0 parts by weight |

Deionized water was added to the above composition to give a solid content of 20% by weight, and sufficiently mixed with stirring employing a homogenizer.

Preparation of Comparative Printing Plate Precursor Sample 15

A comparative printing plate precursor sample 15 was prepared in the same manner as printing plate precursor sample 12, except that the metal iron particles with a particle size of 0.1 μm covered with alumina, which were used as a light heat conversion material in the light sensitive layer coating liquid of Example 3 of Japanese Patent O.P.I. Publication No. 2000-355178, were used.

When the metal iron particles with a particle size of 0.1 μm covered with alumina were heated in a 400° C. oven for 10 minutes, the metal iron particles burned and changed to iron oxide.

b. Evaluation According to Infrared Laser Exposure

The resulting printing plate precursor sample was wound around an exposure drum of a laser exposure device and a cover sheet (a 20 μm thick PET film) for observing degree of ablation was wrapped on the precursor sample. Further, the precursor sample was air-sucked from the interior of the drum and the sheet was fixed to the drum by adhesive tape so that the precursor sample was fixed on the drum. The precursor sample was exposed to an infrared laser beam (having a wavelength of 830 nm and having a beam spot diameter of 8 μm) (to form a 2 cm wide solid line image with a space of 1 cm), changing an exposure power per 1 ch of the laser and exposure energy on the surface of the precursor sample as shown in Table 3. After the exposure, the cover sheet was peeled from the drum, and deposits on the cover sheet at the exposed portions were observed.

The deposits were evaluated according to the following criteria:

A: No deposits were observed.
B: Slight deposits were observed.
C: Some deposits were observed.
D: Apparent deposits were observed.
E: Black deposits were observed.

The results are shown in Table 3.

c. Evaluation of Durability After Exposure of the Hydrophilic Layer Containing a Light Heat Conversion Material An image was formed on the above exposed printing plate precursor sample employing an ink jet process. The ink used was an ink disclosed in Japanese Patent Publication No. 2995075. A 20% dot image with a screen line number of 50 was formed at 600 dpi (dpi shows a dot number per 1 inch or 2.540 cm) on the half of the area of the precursor sample. That is, half of the above exposed portions was regarded as image portions and the other half as non-image portions. The resulting printing plate precursor sample with an image was subjected to heat treatment at 70° C. for 5 minutes.

Printing was carried out employing the resulting printing plate precursor sample. DAIYA 1F-1 produced by Mitsubishi Jukogyo Co., Ltd. was employed as a printing press, and printing was carried out employing a coated paper, dampening water (H solution SG-51 with a concentration of 1.5%, produced by Tokyo Ink Co., Ltd.), and printing ink (Toyo King Hyecho M Magenta, produced by Toyo Ink Manufacturing Co.). After the first ten thousand prints had been printed, the ten thousandth print was observed and evaluated for durability at the image portions of the hydrophilic layer and for contamination at the non-image portions of the hydrophilic layer.

The durability at the image portions was evaluated according to the following criteria:

A: No change was observed.
B: Slight removal of the hydrophilic layer was observed.
C: Apparent contamination due to removal of the hydrophilic layer was observed.

The durability at the non-image portions was evaluated according to the following criteria:

A: No change was observed.
B: Contamination was observed.
C: Apparent contamination due to removal of the hydrophilic layer was observed.

The results are shown in Table 3.

TABLE 3

| Sample No. | Exposure Power (mW)<br>Exposure E (mj/cm²) | 100<br>300 | 100<br>450 | 100<br>600 | 125<br>300 | 125<br>450 | 125<br>600 | 150<br>300 | 150<br>450 | 150<br>600 |
|---|---|---|---|---|---|---|---|---|---|---|
| 11 | Deposits | A | A | A | A | A | A | A | A | A |
| | Durability at image portions | A | A | A | A | A | A | A | A | A |
| | Durability at non-image portions | A | A | A | A | A | A | A | A | A |
| 12 | Deposits | A | A | A | A | A | A | A | A | A |
| | Durability at image portions | A | A | A | A | A | A | A | A | A |
| | Durability at non-image portions | A | A | A | A | A | A | A | A | A |
| 13 | Deposits | A | A | A | A | A | A | A | A | A |
| | Durability at image portions | A | A | A | A | A | A | A | A | A |
| | Durability at non-image portions | A | A | A | A | A | A | A | A | A |
| 14 | Deposits | A | C | E | A | D | E | B | E | E |
| | Durability at image portions | A | B | C | A | B | C | B | C | C |
| | Durability at non-image portions | A | B | C | A | B | C | B | C | C |
| 15 | Deposits | A | C | D | A | D | D | B | D | D |
| | Durability at image portions | A | B | C | A | C | C | B | C | C |
| | Durability at non-image portions | A | B | C | A | C | C | B | C | C |

As is apparent from Table 3 above, the printing plate precursor sample of the invention does not cause ablation under various exposure conditions, and produces no ablated matter, which is a contaminant of the exposure device. Further, it has been proved that the exposed hydrophilic layer after exposure under various exposure conditions maintains high durability, and has high layer strength in both image portions and non-image portions.

Example 2 a. Preparation of Printing Plate Precursor Sample 21

A porous hydrophilic layer coating solution of the following composition was prepared, filtered, then coated on the above obtained substrate 1 by a #10 wire bar, and dried at 80° C. for 5 minutes. The dried hydrophilic layer had a matte surface and it was shown according to microscopic observation that the surface of the hydrophilic layer had an uneven structure having a pitch of from 0.1 to 5 μm.

The content of the carbon atom free material in the layer was 98.9% by weight.

[A Composition of a Porous Hydrophilic Layer Coating Solution]

| | |
|---|---|
| Colloidal silica (alkali type) Snowtex S (solid 30% by weight, produced by Nissan Kagaku Co., Ltd.) | 19.73 parts by weight |
| Necklace shaped colloidal silica (alkali type) Snowtex PSM (solid 20% by weight, produced by Nissan Kagaku Co., Ltd.) | 44.30 parts by weight |
| Porous metal oxide particles Silton AMT 08 (porous aluminosilicate particles having an average particle size of 0.6 μm, produced by Mizusawa Kagaku Co., Ltd.) | 3.50 parts by weight |

-continued

| | |
|---|---|
| Porous metal oxide particles AMT-Silica 300B (porous aluminosilicate particles having an average particle size of 3 μm, produced by Mizusawa Kagaku Co., Ltd.) | 1.00 parts by weight |
| Layer structural clay mineral particles Montmorillonite BENGEL-31 gel prepared by vigorously stirring montmorillonite BENGEL-31 produced by Hojun Yoko Co., Ltd. {pH: 10.1 (2%), swelling power: 48 (ml/2g), viscosity: 2.5 Pa.s (at a 2% concentration, and at 6 rpm)} in water in a homogenizer to give a solid content of 5% by weight | 8.00 parts by weight |
| Aqueous 4% by weight sodium carboxymethyl cellulose solution (Reagent produced by Kanto Kagaku Co., Ltd.) | 5.00 parts by weight |
| Aqueous 10% by weight sodium phosphate.dodecahydrate solution (Reagent produced by Kanto Kagaku Co., Ltd.) | 1.00 parts by weight |
| Aqueous 1% by weight solution of Si-containing surfactant FZ2161 (produced by Nippon Unicar Co., Ltd.) | 2.00 parts by weight |

Deionized water was added to the above composition to give a solid content of 20% by weight, and sufficiently mixed with stirring employing a homogenizer.

The resulting material was aged at 55° C. for 24 hours to obtain a printing plate precursor sample 21.

Preparation of Printing Plate Precursor Sample 22

A printing plate precursor sample 22 was prepared in the same manner as printing plate precursor sample 21, except that the following porous hydrophilic layer coating solution was used. The resulting hydrophilic layer had a matte surface and it was shown according to microscopic observation that the surface of the hydrophilic layer had an uneven structure having a pitch of from 0.1 to 5 μm.

The content of the carbon atom free material in the layer was 97.9% by weight.

[A Composition of a Porous Hydrophilic Layer Coating Solution]

| | |
|---|---|
| Colloidal silica (alkali type) Snowtex S (solid 30% by weight, produced by Nissan Kagaku Co., Ltd.) | 18.80 parts by weight |
| Necklace shaped colloidal silica (alkali type) Snowtex PSM (solid 20% by weight, produced by Nissan Kagaku Co., Ltd.) | 42.20 parts by weight |
| Porous metal oxide particles Silton AMT 08 (porous aluminosilicate particles having an average particle size of 0.6 μm, produced by Mizusawa Kagaku Co., Ltd.) | 5.00 parts by weight |
| Layer structural clay mineral particles Montmorillonite BENGEL-31 gel prepared by vigorously stirring montmorillonite BENGEL-31 produced by Hojun Yoko Co., Ltd. {pH: 10.1 (2%), swelling power: 48 (ml/2g), viscosity: 2.5 Pa.s (at a 2% concentration, and at 6 rpm)} in water in a homogenizer to give a solid content of 5% by weight | 8.00 parts by weight |
| Aqueous 4% by weight sodium carboxyrnethyl cellulose solution (Reagent produced by Kanto Kagaku Co., Ltd.) | 10.00 parts by weight |
| Aqueous 10% by weight sodium phosphate.dodecahydrate solution (Reagent produced by Kanto Kagaku Co., Ltd.) | 1.00 parts by weight |
| Aqueous 1% by weight solution of Si-containing surfactant FZ2161 (produced by Nippon Unicar Co., Ltd.) | 2.00 parts by weight |

Deionized water was added to the above composition to give a solid content of 20% by weight, and sufficiently mixed with stirring employing a homogenizer.

Preparation of Comparative Printing Plate Precursor Sample 23

A comparative printing plate precursor sample 23 was prepared in the same manner as printing plate precursor sample 21, except that the following porous hydrophilic layer coating solution was used. The resulting hydrophilic layer had a glossy surface and it was shown according to microscopic observation that the surface of the hydrophilic layer had a flat structure.

The content of the carbon atom-free material in the layer was not more than 90.0% by weight.

[Sol Gel Liquid 1]

| | |
|---|---|
| Tetramethoxysilane | 20.00 parts by weight |
| Ethanol | 40.00 parts by weight |
| Pure water | 39.98 parts by weight |
| Sulfuric acid | 0.02 parts by weight |

The above materials were mixed in that order, and the mixture was stirred at room temperature for 1 hour to obtain a sol gel liquid 1.

[A Composition of a Porous Hydrophilic Layer Coating Solution]

| | |
|---|---|
| Sol gel liquid 1 | 15.00 parts by weight |
| Colloidal silica (neutral) Snowtex C (solid 20% by weight, produced by Nissan Kagaku Co., Ltd.) | 35.00 parts by weight |
| Aqueous 10% by weight solution of polyvinyl alcohol PVA 117 produced by Kuraray Co., Ltd.) | 20.00 parts by weight |
| Alumina particles (average particle size of 0.05 μm) | 8.00 parts by weight |

Pure water was added to the composition to make a 20% by weight mixture liquid and the liquid was dispersed for 30 minutes employing a sand grinder containing zirconia beads having a diameter of 0.5 mm.

b. Image Formation According to Ink Jet Process

An image was formed on the hydrophilic layer of the above printing plate precursor sample at a dissolving power of 600 dpi according to an ink jet process, employing ink disclosed in Japanese Patent Publication No. 2995075. Ink was dried, and the resulting sample was subjected to heat treatment at 80° C. for 5 minutes to fix the ink image.

c. Image Formation According to Thermal Transfer Process

The printing plate precursor sample sample obtained above was wound around an exposure drum of a digital proof-making device COLOR DECISION, produced by Konica Corporation, instead of the exclusive image receiving sheet with the hydrophilic layer outwardly, and a black ink sheet was further wrapped on the precursor sample. Subsequently, optimum exposure was carried out to form an ink transfer image of a 4000 dpi and a screen line number of 175 lines on the hydrophilic layer, and the resulting sample was subjected to heat treatment at 80° C. for 5 minutes to fix the ink image.

d. Printing Method

The printing plate precursor sample obtained above was mounted on a printing press, DAIYA 1F-1 produced by Mitsubishi Jukogyo Co., Ltd. Printing was carried out employing a coated paper, dampening water (pure water), and printing ink (Toyo King Hyecho M Magenta, produced by Toyo Ink Manufacturing Co.).

e. Evaluation

Background contamination at the beginning of printing, recovery from ink contamination, background contamination on the ten thousandth print after the first ten thousand prints were printed, and printing durability were evaluated. Herein, the background contamination at the beginning of printing was represented by the number of printed paper sheets printed from when printing starts to when prints having a good S/N ratio were obtained. The recovery from ink contamination was represented by the number of printed paper sheets printed from when a dampening water supply roller was separated from the printing plate precursor sample during printing to form an ink layer on the entire surface of the printing plate, printing was stopped for a while, and then printing again started, to when prints having good image were obtained. Printing durability was represented by the number of printed paper sheets printed from when printing started, to when 0.5 point thin line images formed according to the ink jet process became blurred, and by the number of printed paper sheets printed from when printing started, to when 3% small dots formed according to the thermal transfer process disappeared. The results are shown in Table 4.

TABLE 4

| Sample No. | Image forming process | Background contamination at the beginning of printing | Recovery from ink contamination | Background contamination on the ten thousandth print | Printing durability |
|---|---|---|---|---|---|
| 21 | Ink jet | 10 | 20 | None | Not less than 10000 |
| | Thermal transfer | 10 | 20 | None | Not less than 10000 |
| 22 | Ink jet | 10 | 20 | None | Not less than 10000 |
| | Thermal transfer | 10 | 20 | None | Not less than 10000 |
| 23 | Ink jet | 50 | 100 | Noted | 3000 |
| | Thermal transfer | 50 | 100 | Noted | 2000 |

As is apparent from Table 4 above, the printing plate precursor sample of the invention provides an excellent printing performance, and strongly fixes images formed according to an ink jet process or a thermal transfer process, resulting in high printing durability.

a. Preparation of Printing Plate Precursor Sample

[Ablation Layer]

An ablation layer coating solution of the following composition was prepared, filtered, then coated on the above obtained substrate 2 by a #10 wire bar, and dried at 55° C. for 5 minutes.

| | |
|---|---|
| Colloidal silica (alkali type) Snowtex S (solid 30% by weight, produced by Nissan Kagaku Co., Ltd.) | 30.0 parts by weight |
| Necklace shaped colloidal silica (alkali type) Snowtex PSM (solid 20% by weight, produced by Nissan Kagaku Co., Ltd.) | 30.0 parts by weight |
| Carnauba wax emulsion A118 (having a solid content of 40% by weight, the wax having an average particle size of 0.3 $\mu$m, a melting viscosity at 140° C. of 0.008 P.s, a softening point of 65° C. and a melting point of 80° C., produced by GifuCerac Co., Ltd.) | 20.0 parts by weight |
| Carbon black aqueous dispersion SD9020 (Solid content of 30% by weight, produced by Dainippon Ink Co., Ltd.) | 20.0 parts by weight |

-continued

Deionized water was added to the above composition to give a solid content of 20% by weight, and sufficiently mixed with stirring.

Preparation of Printing Plate Precursor Sample 31

The hydrophilic layer used in the preparation of the printing plate precursor sample 22 was coated on the above obtained ablation layer by a #4 wire bar, and dried at 70° C. for 5 minutes. An aqueous 3% by weight sodium carboxymethyl cellulose solution (Reagent produced by Kanto Kagaku Co., Ltd.) was prepared, and filtered. The resulting solution was coated on the above obtained hydrophilic layer by a #5 wire bar, and dried at 70° C. for 5 minutes to form a protective layer having a coating amount of 0.3 g/m$^2$.

The resulting plate was adhered to a 190 $\mu$m thick aluminum plate through an adhesive so that the surface of the substrate opposite the hydrophilic layer faces the aluminum plate, and aged at 55° C. for 24 hours. Thus, printing plate precursor sample 31 was obtained.

Preparation of Comparative Printing Plate Precursor Sample 32

A comparative printing plate precursor sample 32 was prepared in the same manner as printing plate precursor sample 31, except that the hydrophilic layer coating solution used in the manufacture of printing plate precursor sample sample 23 was used as a hydrophilic layer coating solution.

Preparation of Comparative Printing Plate Precursor Sample 33

A comparative printing plate precursor sample 33 was prepared in the same manner as printing plate precursor sample 32, except that an aqueous 3% by weight solution of polyvinyl alcohol PVA 117 (produced by Kuraray Co., Ltd.) was used as a coating solution for the protective layer.

Preparation of Comparative Printing Plate Precursor Sample 34

A comparative printing plate precursor sample 34 was prepared in the same manner as printing plate precursor sample 32, except that the protective layer was not provided.

b. Image Formation According to Infrared Laser Exposure

The resulting printing plate precursor sample was wound around an exposure drum of a laser exposure device and a cover sheet (a 20 $\mu$m thick PET film) for observing degree of ablation was wrapped on the precursor sample. Further, the precursor sample was air-sucked from the interior of the drum and the sheet was fixed on the drum by adhesive tape so that the precursor sample was fixed on the drum. The precursor sample was exposed to infrared laser beam (having a wavelength of 830 nm and having a beam spot diameter of 8 $\mu$m) under exposure conditions of an exposure power of 120 mW per 1 ch and an exposure energy of 450 mj/cm$^2$ on the surface of the precursor sample to form an image at a resolving power of 4000 dpi and at a screen line number of 175. After the exposure, the cover sheet was peeled from the drum, and deposits on the cover sheet at the exposed portions were observed. The results are shown in Table 5.

c. Evaluation of Formed Image on the Printing Plate Precursor Sample

The surface of the exposed printing plate precursor sample sample was washed with a sponge impregnated with water to remove the protective layer and/or ablation layer, and dried. Subsequently, the surface of the resulting printing plate was observed through a microscope. The exposed portions in each of the line image with a line and space at 2000 dpi in the main laser scanning direction (longitudinal), the line image with a line and space at 2000 dpi in the direction (transverse) perpendicular to the main laser scanning direction, and the line image with a line and space at 2000 dpi in the direction (oblique) inclined at an angle of 45° to the main laser scanning direction were evaluated for removal thereof, and 2% small dots were evaluated for uniformity. The results are shown in Table 5.

d. Printing Method

The exposed printing plate precursor sample was mounted without any development on a printing press, DAIYA 1F-1 produced by Mitsubishi Jukogyo Co., Ltd. Printing was carried out employing a coated paper, dampening water (pure water), and printing ink (Toyo King Hyecho M Magenta, produced by Toyo Ink Manufacturing Co.).

e. Evaluation

Background contamination at the beginning of printing (evaluated in terms of the number of printed paper printed from when printing starts to when prints having a good S/N ratio are obtained), recovery from ink contamination (represented by the number of prints printed from when a dampening water supply roller was separated from the printing plate precursor sample while printing to form an ink layer on the entire surface of the printing plate, printing was stopped for a while, and then printing again started to when prints having a good S/N ratio were obtained), and background contamination on the ten thousandth print after the first ten thousand prints were printed were evaluated. The results are shown in Table 5.

As is apparent from Table 5 above, the printing plate precursor sample of the invention provides an image with an excellent image quality and a high dissolving degree, which is formed according to an ablation image forming process, resulting in high printing performance.

Example 4 a. Preparation pf Printing Plate Precursor Sample

[Preparation of Paste (A) Containing a Light Heat Conversion Material and a Filler]

Paste (A), containing a light heat conversion material and a filler, was prepared according to the following procedures:

[Preparation of Filler Dispersion (A)]

The filler dispersion (A) having the following composition was prepared.

[A Composition for Filler Dispersion (A)]

| | |
|---|---|
| Aqueous 4% by weight sodium carboxymethyl cellulose solution (Reagent produced by Kanto Kagaku Co., Ltd.) | 32.14 parts by weight |
| Pure water | 32.50 parts by weight |
| Aqueous 10% by weight sodium phosphate.dodecahydrate solution (Reagent produced by Kanto Kagaku Co., Ltd.) | 6.43 parts by weight |
| Porous metal oxide particles Silton AMT 08 (porous aluminosilicate particles having an average particle size of 0.6 μm, produced by Mizusawa Kagaku Co., Ltd.) | 28.93 parts by weight |

The above materials were mixed in that order, and sufficiently stirred.

Subsequently, paste (A) having the following composition was prepared. Mixing and dispersing were carried out employing a homogenizer (produced by Nippon Seiki Seisakusho Co., Ltd.). Dispersing was carried out at 10000 rpm for 10 minutes. Thus, paste (A) having a solid content of 25% by weight was obtained.

TABLE 5

| Sample No. | Deposits | Formed image: 2000 dpi line and space (longitudinal) | 2000 dpi line and space (transverse) | 2000 dpi line and space (oblique) | 2% dots | Background contamination at the beginning of printing | Recovery from ink contamination | Background contamination on the ten thousandth print |
|---|---|---|---|---|---|---|---|---|
| 31 | None | Good | Good | Good | Uniform | 12 | 20 | None |
| 32 | None | a | b | d | e | 15 | 100 | Noted |
| 33 | None | a | b | d | e | 25 | 100 | Noted |
| 34 | Present | a | c | c | f | 14 | 100 | Noted |

In Table 5 above,
"a" shows that notches are observed on the line edge but the ablation layer is removed.
"b" shows that line width is non-uniform and a part of the ablation layer is not removed.
"c" shows that line width is non-uniform but the ablation layer is removed.
"d" shows that the ablated layer forms a broken line.
"e" shows that the dot shape is non-uniform and about 50% of the dot area is not removed.
"f" shows that the dot shape is non-uniform and about 30% of the dot area is not removed.

[A Composition for Paste (A)]

| | |
|---|---|
| Filler dispersion (A) | 55.56 parts by weight |
| Montmorillonite BENGEL-31 gel prepared by vigorously stirring montmorillonite BENGEL-31 produced by Hojun Yoko Co., Ltd. {pH: 10.1 (2%), swelling power: 48 (ml/2g), viscosity: 2.5 Pa.s (a 2% concentration, 6 rpm)} in water in a homogenizer to give a solid content of 5% by weight | 28.57 parts by weight |
| Cu—Fe—Mn type metal oxide black pigment: TM-3550 black aqueous dispersion {prepared by dispersing TM-3550 black powder having a particle size of 0.1 μm produced by Dainichi Seika Kogyo Co., Ltd. in water to give a solid content of 40.5% by weight (including 0.5% by weight of dispersant)} | 15.87 parts by weight |

[Preparation of Paste (B)]

Paste (B) was prepared in the same manner as in Paste (A), except that the heated TM-3550 black powder used in the preparation of the printing plate precursor sample 13 was used instead of the TM-3550 black aqueous dispersion.

[Preparation of Colloidal Silica Mixture Liquid]

The following composition was sufficiently mixed to prepare a colloidal silica mixture liquid.

[Composition of Colloidal Silica Mixture Liquid]

| | |
|---|---|
| Colloidal silica (alkali type) Snowtex S (solid 30% by weight, produced by Nissan Kagaku Co., Ltd.) | 24.07 parts by weight |
| Necklace shaped colloidal silica (alkali type) Snowtex PSM (solid 20% by weight, produced by Nissan Kagaku Co., Ltd.) | 54.02 parts by weight |
| Aqueous 1% by weight solution of Si-containing surfactant FZ2161 (produced by Nippon Unicar Co., Ltd.) | 3.01 parts by weight |
| Pure water | 18.9 parts by weight |

Preparation of Printing Plate Precursor Sample 41

A porous hydrophilic layer coating solution of the following composition was prepared, filtered, then coated on the above obtained substrate 2 by a #5 wire bar, and dried at 70° C. for 5 minutes. The dried hydrophilic layer had a matte surface and it was shown according to microscopic observation that the surface of the hydrophilic layer had an uneven structure having a pitch of from 0.1 to 5 μm.

The content of the carbon atom free material in the hydrophilic layer was 98.78% by weight.

[A Composition of a Porous Hydrophilic Layer Coating Solution]

| | |
|---|---|
| Paste (A) | 28.00 parts by weight |
| Colloidal silica mixture liquid | 72.00 parts by weight |

The colloidal silica mixture liquid was added little by little to the Paste (A) while stirring to obtain a porous hydrophilic layer coating solution having a solid content of 20% by weight.

Subsequently, the following image forming layer coating solution was prepared, and filtered. The resulting solution was coated on the above obtained hydrophilic layer by a #5 wire bar, and dried at 55° C. for 5 minutes to form an image forming layer having a coating amount of 0.6 g/m$^2$.

[A Composition of an Image Forming Layer Coating Solution]

| | |
|---|---|
| Aqueous 5% by weight solution of disaccharide trehalose powder (Trehaose, mp. 97° C., produced by Hayashihara Shoji Co., Ltd.) | 55.00 parts by weight |
| Dispersion prepared by diluting with pure water carnauba wax emulsion A118 (having a solid content of 40% by weight, the wax having an average particle size of 0.3 μm, a melting viscosity at 140° C. of 0.008 P.s, a softening point of 65° C., and a melting point of 80° C., producedby GifuCerac Co., Ltd.) to give a solid content of 5% by weight | 45.00 parts by weight |

The resulting plate was adhered to a 190 μm thick aluminum plate through an adhesive so that the surface of the substrate opposite the hydrophilic layer faces the aluminum plate, and aged at 55° C. for 24 hours. Thus, printing plate precursor sample 41 was obtained.

Preparation of Printing Plate Precursor Sample 42

A printing plate precursor sample 42 was prepared in the same manner as printing plate precursor sample 41, except that the following image forming layer coating solution was used. The resulting image forming layer had a matte surface and it was shown according to microscopic observation that the surface of the image forming layer had an uneven structure having a pitch of from 0.1 to 5 μm. The content of the carbon atom free material in the hydrophilic layer was 98.78% by weight.

[A Composition of an Image Forming Layer Coating Solution]

| | |
|---|---|
| Aqueous 5% by weight solution of disaccharide trehalose powder (Trehaose, mp. 97° C., produced by Hayashihara Shoji Co., Ltd.) | 30.00 parts by weight |
| Dispersion prepared by diluting with pure water carnauba wax emulsion A118 (having a solid content of 40% by weight, the wax having an average particle size of 0.3 μm, a melting viscosity at 140° C. of 0.008 P.s, a softening point of 65° C., and a melting point of 80° C., producedby GifuCerac Co., Ltd.) to give a solid content of 5% by weight | 40.00 parts by weight |
| Dispersion prepared by diluting with pure water an aqueous polymer particle dispersion Yodosol GD87B (having a solid content of 50% by weight, an average particle size of 90 nm, and a Tg of 60° C., produced by Kanebo NSC Co., Ltd.) to give a solid content of 5% by weight | 30.00 parts by weight |

A printing plate precursor sample 43 was prepared in the same manner as printing plate precursor sample 42, except that paste (B) was used instead of paste (A). The resulting image forming layer had a matte surface and it was shown according to microscopic observation that the surface of the image forming layer had an uneven structure having a pitch of from 0.1 to 5 μm. The content of the carbon atom free material in the hydrophilic layer was 98.78% by weight.

Preparation of Printing Plate Precursor Sample 44

A printing plate precursor sample 44 was prepared in the same manner as printing plate precursor sample 43, except that Substrate 3 was used and adherence of the aluminum plate to the printing plate precursor sample was not carried. The resulting image forming layer had a matte surface and it was shown according to microscopic observation that the surface of the image forming layer had an uneven structure having a pitch of from 0.1 to 5 μm. The content of the carbon atom free material in the hydrophilic layer was 98.78% by weight.

Preparation of Comparative Printing Plate Precursor Sample 45

A porous hydrophilic layer coating solution of the following composition was prepared, filtered, then coated on the above obtained substrate 2 by a #5 wire bar, and dried at 70° C. for 5 minutes. The resulting hydrophilic layer had a glossy surface and it was shown according to microscopic observation that the surface of the hydrophilic layer had a flat structure. The content of the carbon atom free material in the hydrophilic layer was 89.9% by weight.

[(A Composition of a Porous Hydrophilic Layer Coating Solution]

| | |
|---|---|
| Colloidal silica mixture liquid | 72.00 parts by weight |
| Porous metal oxide particles Silton AMT 08 (porous aluminosilicate particles having an average particle size of 0.6 μm, produced by Mizusawa Kagaku Co., Ltd.) | 5.00 parts by weight |
| Carbon black aqueous dispersion SD9020 (Solid content of 30% by weight, produced by Dainippon Ink Co., Ltd.) | 6.67 parts by weight |

Deionized water was added to the above composition to give a solid content of 20% by weight, and sufficiently mixed with stirring.

Subsequently, the image forming layer coating solution was coated on the above obtained hydrophilic layer, dried, and adhered to the aluminum plate in the same manner as in printing plate precursor sample 41. Thus, printing plate precursor sample 45 was obtained.

Preparation of Comparative Printing Plate Precursor Sample 46

A porous hydrophilic layer coating solution of the following composition was prepared, filtered, then coated on the above obtained substrate 2 by a #5 wire bar, and dried at 70° C. for 5 minutes. The resulting hydrophilic layer had a glossy surface and it was shown according to microscopic observation that the surface of the hydrophilic layer had a flat structure. The content of the carbon atom free material in the hydrophilic layer was not more than 81% by weight.

[A Composition of a Porous Hydrophilic Layer Coating Solution]

-continued

| | |
|---|---|
| Porous hydrophilic layer coating solution used in the preparation of printing plate precursor sample 23 (a solid content of 20% by weight) | 90.00 parts by weight |
| Carbon black aqueous dispersion SD9020 (Solid content of 30% by weight, produced by Dainippon Ink Co., Ltd.) | 6.67 parts by weight |

Deionized water was added to the above composition to give a solid content of 20% by weight, and sufficiently mixed with stirring.

Subsequently, the image forming layer coating solution was coated on the above obtained hydrophilic layer, dried, and adhered to the aluminum plate in the same manner as in printing plate precursor sample 41. Thus, printing plate precursor sample 46 was obtained.

b. Image Formation According to Infrared Laser Exposure

The printing plate precursor sample obtained above was wound around a drum for a laser exposure, fixed on the drum, and were imagewise exposed to an infrared laser (having a wavelength of 830 nm and a beam spot diameter of 8 μm) at a resolving degree of 4,000 dpi and at a screen line number of 175 to form an image. The exposure energy was 250 $mj/cm^2$ at the surface of the plate precursor sample, and the exposure power was 100 mW per ch at the surface of the plate precursor sample. Thus, printing plate 1 was prepared. (The term, "dpi" shows the number of dots per 2.54 cm.)

c. Printing Method

The exposed printing plate precursor sample was mounted without any development on a printing press, DAIYA 1F-1 produced by Mitsubishi Jukogyo Co., Ltd. Printing was carried out employing a coated paper, dampening water (pure water), and printing ink (Toyo King Hyecho M Magenta, produced by Toyo Ink Manufacturing Co.).

d. Evaluation

Background contamination at the beginning of printing (evaluated in terms of the number of printed paper printed from when printing starts to when prints having a good S/N ratio are obtained), recovery from ink contamination (represented by the number of prints printed from when a dampening water supply roller was separated from the printing plate precursor sample while printing to form an ink layer on the entire surface of the printing plate, printing was stopped for a while, and then printing again started to when prints having a good S/N ratio were obtained), background contamination on the ten thousandth print after the first ten thousand prints were printed, blanket contamination at the time when ten thousand prints were printed, and printing durabilty (represented by the number of prints printed from when printing started, to when 2% dots began disappearing on the printed matter) were evaluated. The results are shown in Table 6.

TABLE 6

| Sample No. | Background contamination at the beginning of printing | Recovery from ink contamination | Background contamination on the ten thousandth print | Blanket contamination at the time when ten thousand prints were printed | Printing durability |
|---|---|---|---|---|---|
| 41 | 10 | 20 | None | None | 18000 |
| 42 | 12 | 20 | None | None | Not less than 20000 |
| 43 | 12 | 20 | None | None | Not less than 20000 |
| 44 | 12 | 20 | None | None | Not less than 20000 |
| 45 | 15 | 100 | Slight contamination | Slight contamination | 2000 |
| 46 | 20 | 100 | Apparent contamination | Apparent contamination | 2000 |

As is apparent from Table 6 above, the printing plate precursor sample of the invention provided excellent printing performance and printing durability, also when the printing plate precursor sample had a heat fusible image forming layer on the hydrophilic layer.

In any image forming process of the examples 2, 3 and 4 above, the printing plate precursor sample of the invention does not require any specific development, and minimizes waste paper at the beginning of printing. Accordingly, it has been proved that the printing plate precursor sample of the invention can be applied to an image formation on a printing press

[Effects of the Invention]

The present invention provides a printing plate precursor having a hydrophilic layer which is applied to CTP requiring no specific development and provides a good printing performance a printing plate precursor having a hydrophilic layer containing a light heat conversion material, in which when subjected to infrared laser exposure, an image can be formed without ablation, and a printing plate precursor having a hydrophilic layer, in which after subjected to infrared laser exposure and heated, the strength of the hydrophilic layer is not lowered. Further, the present invention provides a printing method employing the printing plate precursor described above, which provides a good working environment.

What is claimed is:

1. A printing plate precursor comprising a substrate and provided thereon, a layer containing a light heat conversion material, wherein the light heat conversion material is a Cu—Cr—Mn type metal oxide, or a Cu—Fe—Mn type metal oxide.

2. A printing plate precursor comprising a substrate and provided thereon, a hydrophilic layer which is porous, wherein the hydrophilic layer contains colloidal silica, porous metal oxide particles or layer structural clay mineral particles in an amount of not less than 91% by weight.

3. The printing plate precursor of claim 2, wherein the colloidal silica is necklace-shaped colloidal silica.

4. The printing plate precursor of claim 2, wherein the colloidal silica particles have an average particle size of 1 to 20 nm.

5. The printing plate precursor of claim 2, wherein the colloidal silica provides an alkaline colloidal silica solution as a colloid solution.

6. The printing plate precursor of claim 2, wherein the metal oxide particles are porous silica particles, porous aluminosilicate particles or zeolite particles.

7. The printing plate precursor of claim 2, wherein the hydrophilic layer further contains a carbon atom-containing material which is water soluble, and wherein at least a part of the carbon atom-containing material exists in the hydrophilic layer in a state capable of being dissolved in water.

8. The printing plate precursor of claim 7, wherein the carbon atom-containing material is a saccharide.

9. The printing plate precursor of claim 8, wherein the saccharide is a polysaccharide.

10. The printing plate precursor of claim 2, wherein the hydrophilic layer further contains a surfactant.

11. The printing plate precursor of claim 10, wherein the surfactant comprises a silicon atom.

12. The printing plate precursor of claim 2, wherein the hydrophilic layer further contains a phosphate.

13. The printing plate precursor of claim 2, wherein the hydrophilic layer further contains a light heat conversion material.

14. The printing plate precursor of claim 13, wherein the light heat conversion material is a material which does not substantially change in nature in a temperature of 400 to 500° C. for ten minutes.

15. The printing plate precursor of claim 14, wherein the light heat conversion material is a metal oxide.

16. The printing plate precursor of claim 15, wherein the metal oxide is a complex metal oxide comprising at least two kinds of metals.

17. The printing plate precursor of claim 16, wherein the complex metal oxide comprises at least two metals selected from the group consisting of Al, Ti, Cr, Mn, Fe, Co, Ni, Cu, Zn, Sb, and Ba.

18. The printing plate precursor of claim 14, wherein the light heat conversion material has been allowed to stand in a temperature atmosphere of 400 to 500° C. for ten minutes in its manufacture process.

19. The printing plate precursor of claim 13, wherein the light heat conversion material has an average primary particle size of 0.001 to 1.0 $\mu$m.

20. The printing plate precursor of claim 19, wherein the light heat conversion material has an average primary particle size of 0.1 to 0.5 $\mu$m.

21. The printing plate precursor of claim 2, wherein the printing plate precursor further comprises a functional layer capable of forming an image.

22. The printing plate precursor of claim 2, wherein an ablation layer being ablated by heat application is provided between the substrate and the hydrophilic layer, and a layer containing a water soluble material is provided on the hydrophilic layer.

23. The printing plate precursor of claim 22, wherein the water soluble material is a saccharide.

24. The printing plate precursor of claim 23, wherein the saccharide is a polysaccharide.

25. The printing plate precursor of claim 2, wherein a layer containing at least one selected from heat fusible particles and thermoplastic particles is provided on the hydrophilic layer.

26. The printing plate precursor of claim 2, wherein the layer containing at least one selected from heat fusible particles and thermoplastic particles further contains a water soluble material.

27. The printing plate precursor of claim 26, wherein the water soluble material is a saccharide.

28. The printing plate precursor of claim 27, wherein the saccharide is an oligosaccharide.

29. A printing plate precursor, comprising a substrate and provided thereon, a hydrophilic layer which is porous, wherein the hydrophilic layer contains a carbon atom-free material in an amount of not less than 91% by weight, and a light heat conversion material which is a Cu-Cr-Mn type metal oxide or a Cu-Fe-Mn type metal oxide.

* * * * *